(12) United States Patent
Streeter et al.

(10) Patent No.: US 7,959,503 B2
(45) Date of Patent: Jun. 14, 2011

(54) GAME APPARATUS

(75) Inventors: Gary R. Streeter, Andover, MA (US); Kenneth E. Irwin, Jr., Dawsonville, GA (US); Mark Tevis, Dawsonville, GA (US)

(73) Assignee: Scientific Games International, Inc., Newark, DE (US)

( * ) Notice: Subject to any disclaimer, the term of this patent is extended or adjusted under 35 U.S.C. 154(b) by 561 days.

(21) Appl. No.: 11/895,818

(22) Filed: Aug. 28, 2007

(65) Prior Publication Data

US 2008/0084024 A1 Apr. 10, 2008

Related U.S. Application Data

(60) Provisional application No. 60/923,383, filed on Apr. 13, 2007, provisional application No. 60/840,745, filed on Aug. 29, 2006.

(51) Int. Cl.
*A63F 9/24* (2006.01)
*A63F 13/00* (2006.01)
*G06F 17/00* (2006.01)
*G06F 19/00* (2006.01)

(52) U.S. Cl. ....... 463/17; 235/61.11; 235/492; 235/487; 340/173 R; 257/761; 428/195; 463/16; 463/20; 463/25

(58) Field of Classification Search ...................... 463/17
See application file for complete search history.

(56) References Cited

U.S. PATENT DOCUMENTS

| | | | | |
|---|---|---|---|---|
| 3,699,311 A | * | 10/1972 | Dunbar | 235/451 |
| 4,582,324 A | | 4/1986 | Koza et al. | |
| 5,110,129 A | | 5/1992 | Alvarez | |
| 5,471,039 A | * | 11/1995 | Irwin et al. | 235/441 |
| 5,475,205 A | * | 12/1995 | Behm et al. | 235/375 |
| 5,569,082 A | | 10/1996 | Kaye | |
| 5,599,046 A | * | 2/1997 | Behm et al. | 283/83 |
| 5,621,200 A | * | 4/1997 | Irwin et al. | 235/375 |
| 5,709,603 A | | 1/1998 | Kaye | |
| 5,997,044 A | | 12/1999 | Behm et al. | |
| 6,053,405 A | * | 4/2000 | Irwin et al. | 235/375 |
| 6,379,742 B1 | | 4/2002 | Behm et al. | |
| 6,425,526 B1 | * | 7/2002 | Fidalgo et al. | 235/492 |
| 6,435,408 B1 | * | 8/2002 | Irwin et al. | 235/441 |
| 6,484,945 B1 | * | 11/2002 | John et al. | 235/487 |

(Continued)

FOREIGN PATENT DOCUMENTS

WO    WO 2004/110578    12/2004

OTHER PUBLICATIONS

PCT Search Report, Apr. 28, 2008.

(Continued)

*Primary Examiner* — Paul A. D'Agostino
(74) *Attorney, Agent, or Firm* — Dority & Manning, P.A.

(57) ABSTRACT

Described is a player activated game system, particularly adapted for playing instant lottery type games, that includes a game device having a computer containing at least one game, an electronic display and a card interface adapted to receive a game card having data that represents a particular game outcome such that connection of the card to the interface can result the game being played by the device with the particular outcome displayed on the display. Also described are lottery tickets or game cards that are adapted use with the game devices along with methods of manufacturing the game cards.

17 Claims, 39 Drawing Sheets

U.S. PATENT DOCUMENTS

| | | | | |
|---|---|---|---|---|
| 6,491,215 | B1* | 12/2002 | Irwin et al. | 235/375 |
| 6,752,319 | B2* | 6/2004 | Ehrhart et al. | 235/486 |
| 7,347,776 | B2* | 3/2008 | Wright | 463/17 |
| 2002/0109295 | A1 | 8/2002 | Browne et al. | |
| 2002/0193157 | A1 | 12/2002 | Yamada et al. | |
| 2004/0053011 | A1* | 3/2004 | Behm et al. | 428/195 |
| 2004/0235550 | A1 | 11/2004 | McNally et al. | |
| 2005/0140091 | A1* | 6/2005 | Brickwood et al. | 273/269 |
| 2005/0150740 | A1* | 7/2005 | Finkenzeller et al. | 194/207 |
| 2005/0156318 | A1* | 7/2005 | Douglas | 257/761 |
| 2006/0028379 | A1* | 2/2006 | Oberle | 343/700 MS |
| 2009/0075713 | A1* | 3/2009 | Hartman et al. | 463/19 |

OTHER PUBLICATIONS

EPO Search Report, Sep. 6, 2006.

* cited by examiner

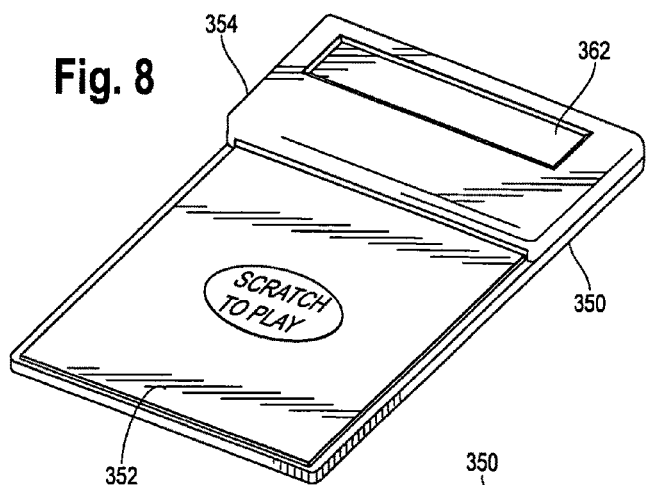
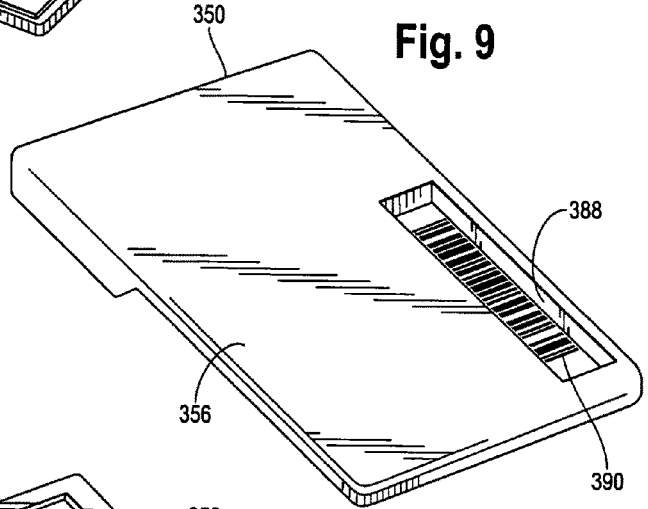
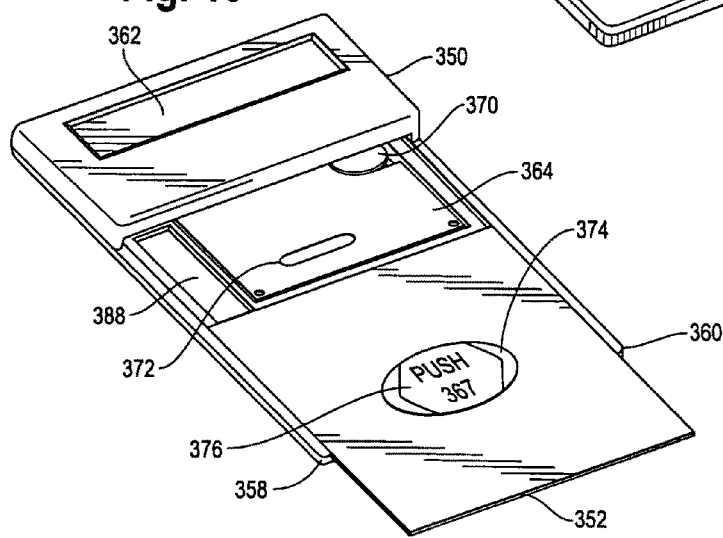

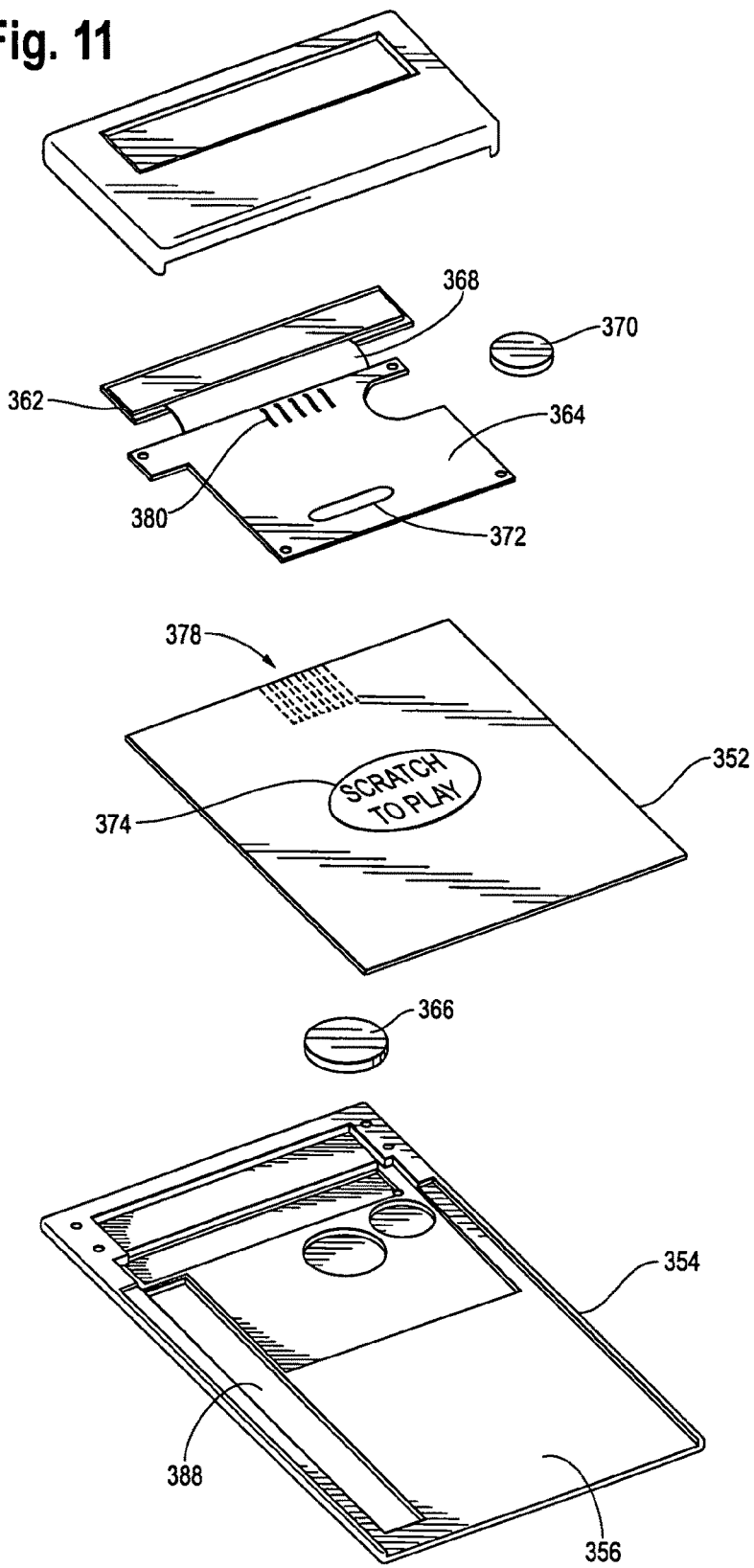

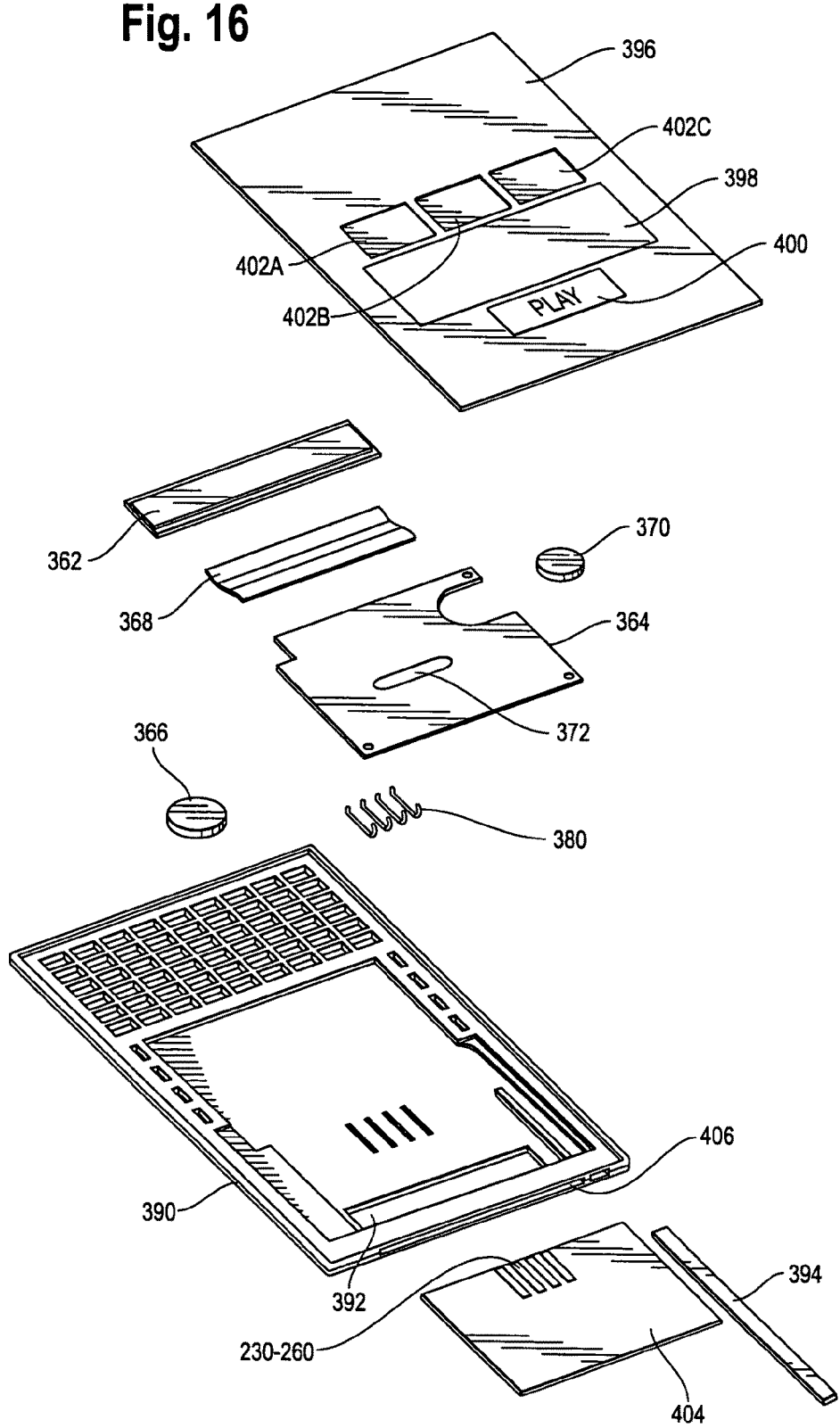

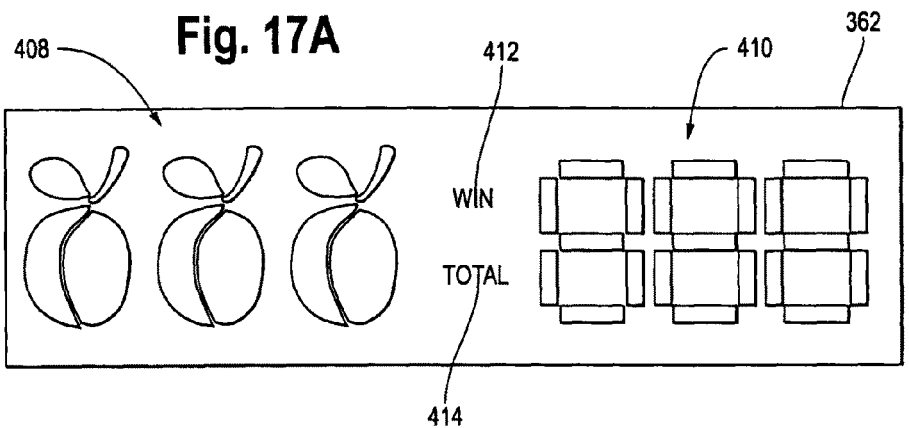
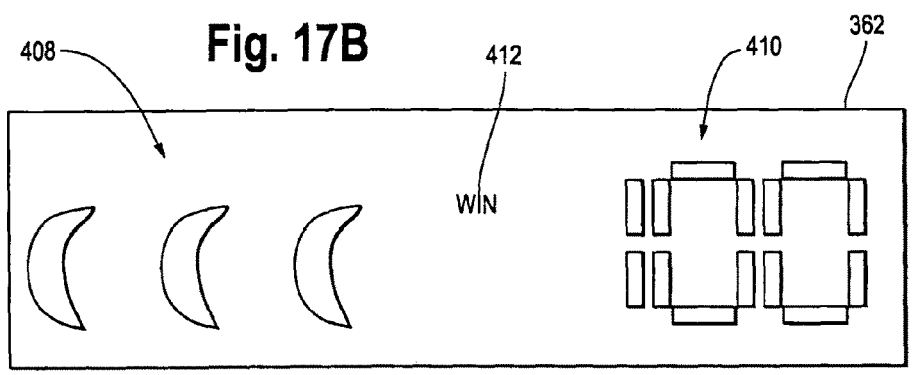
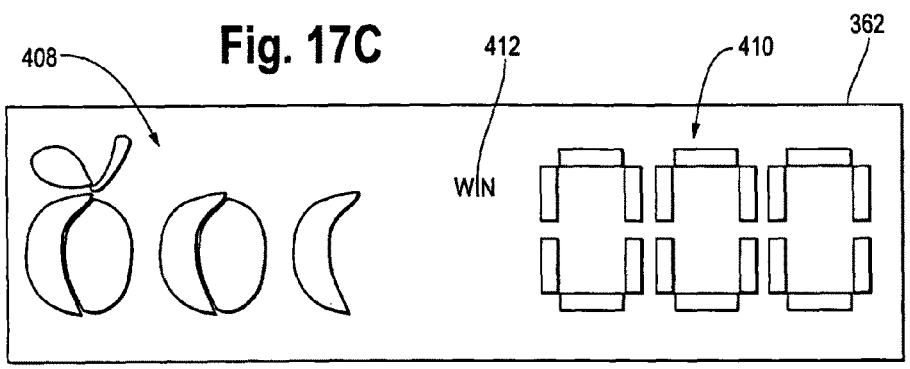

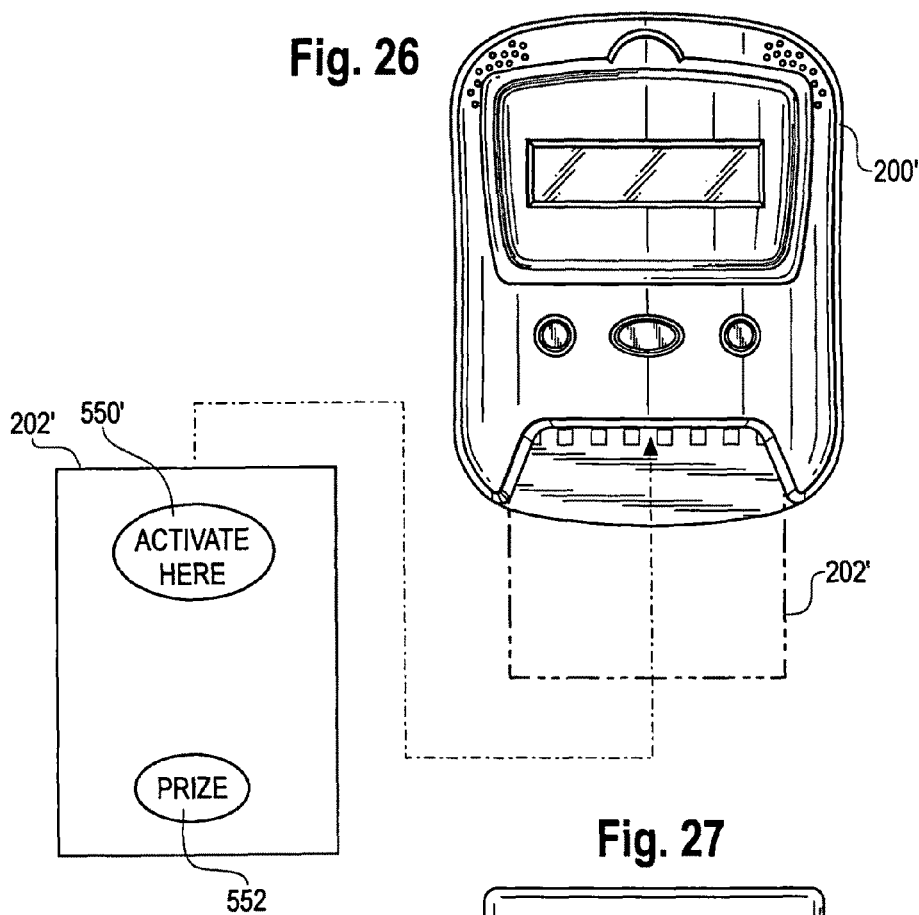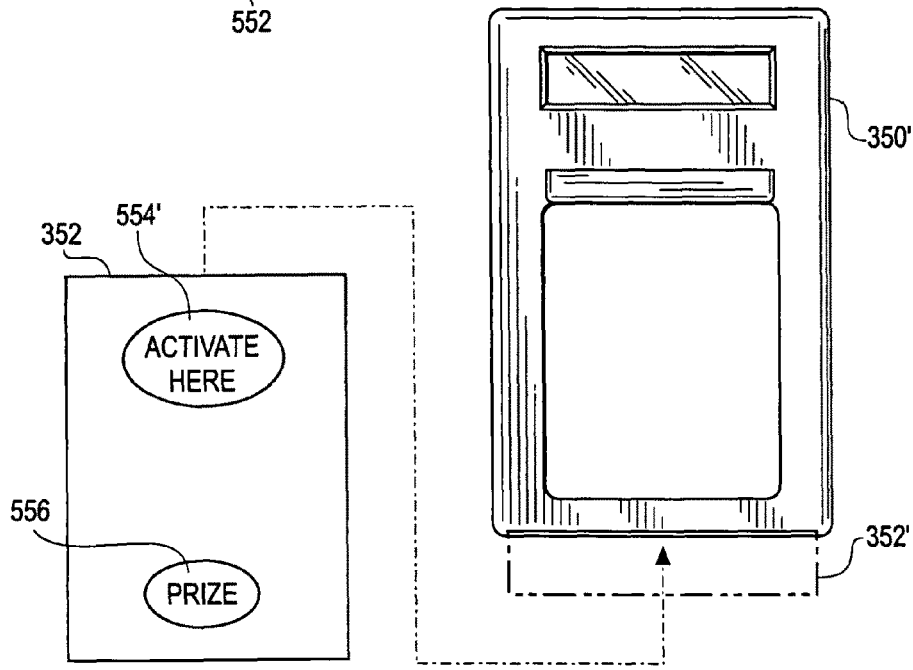

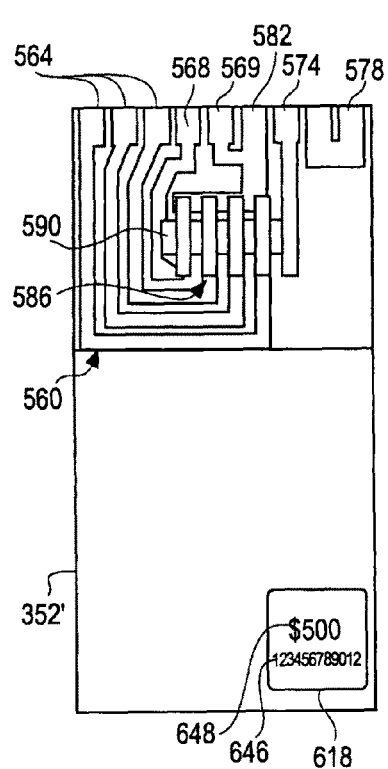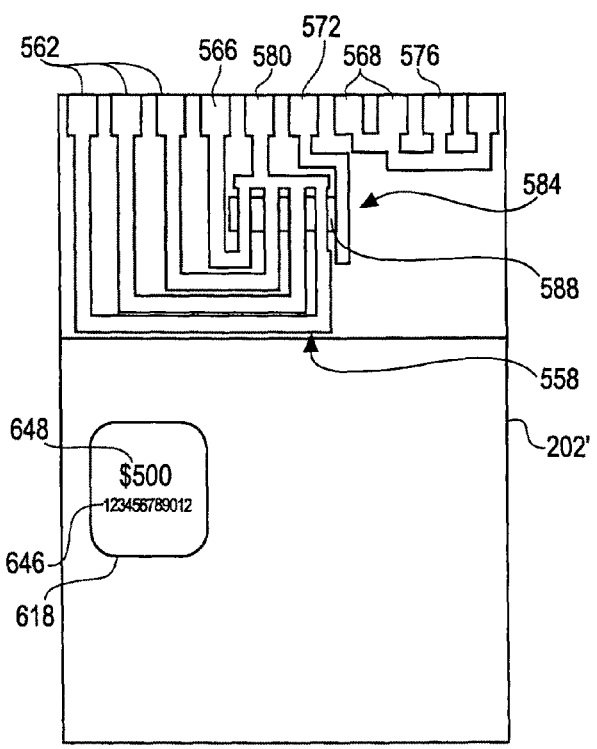

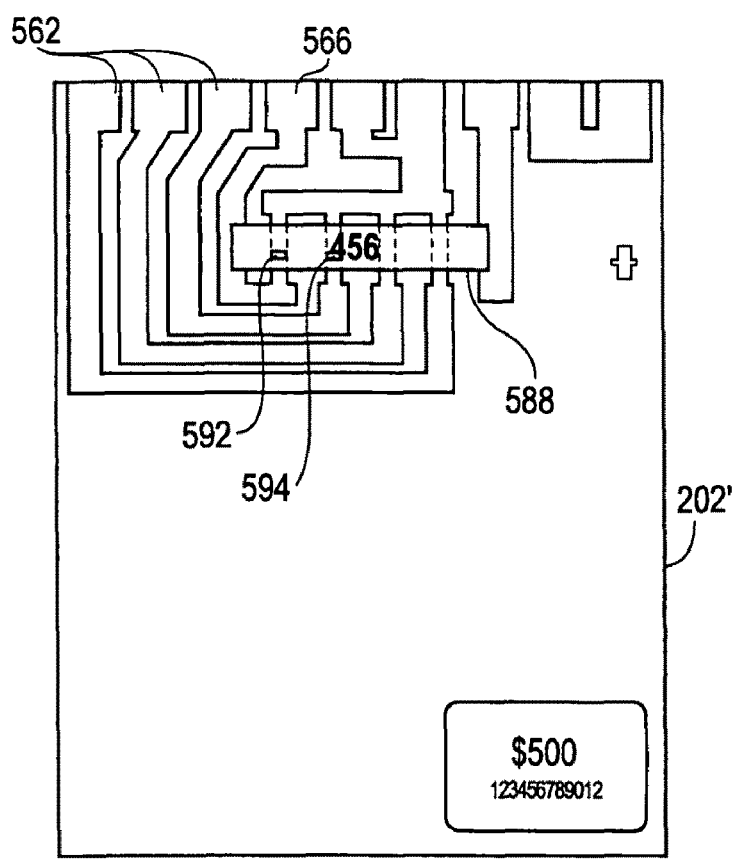

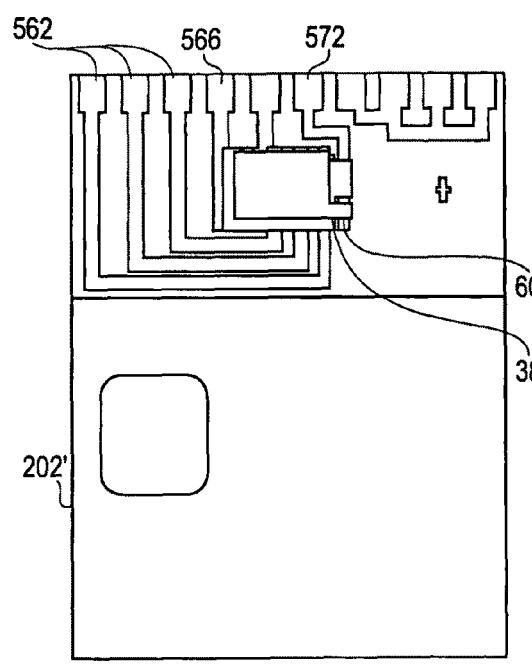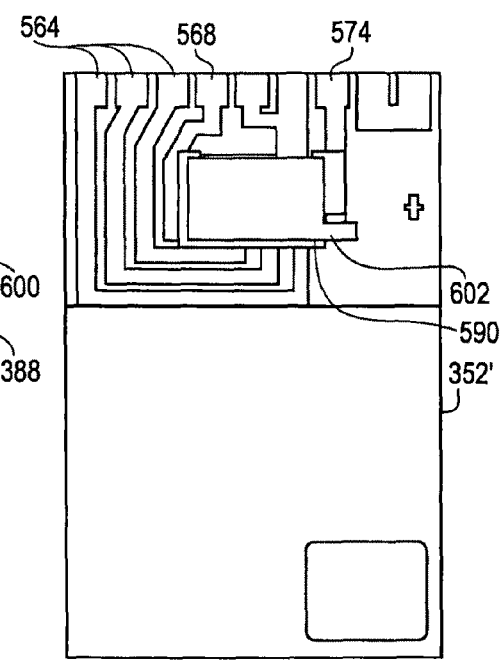

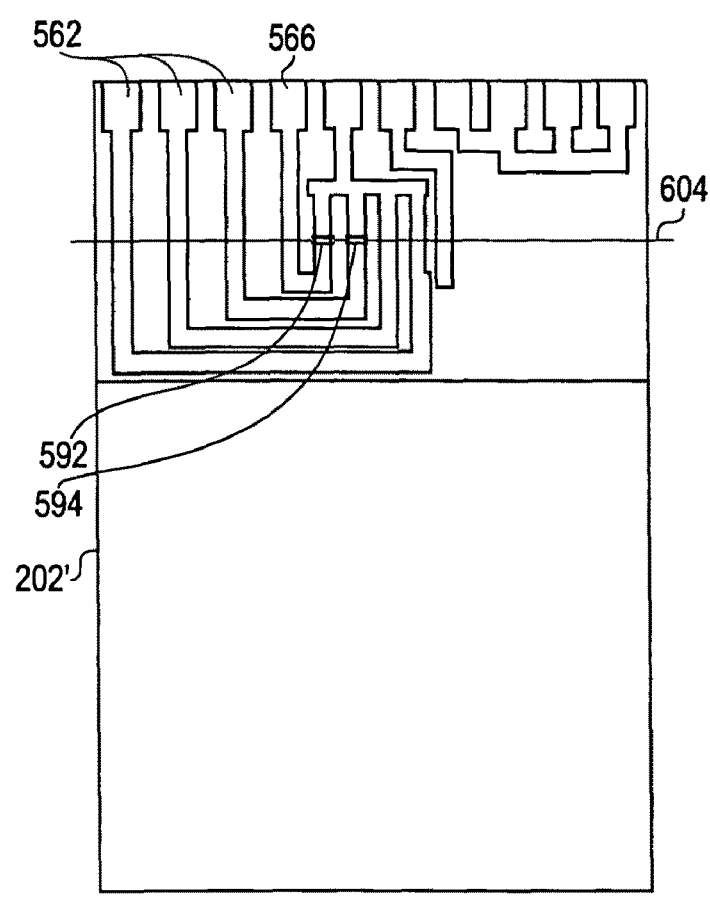

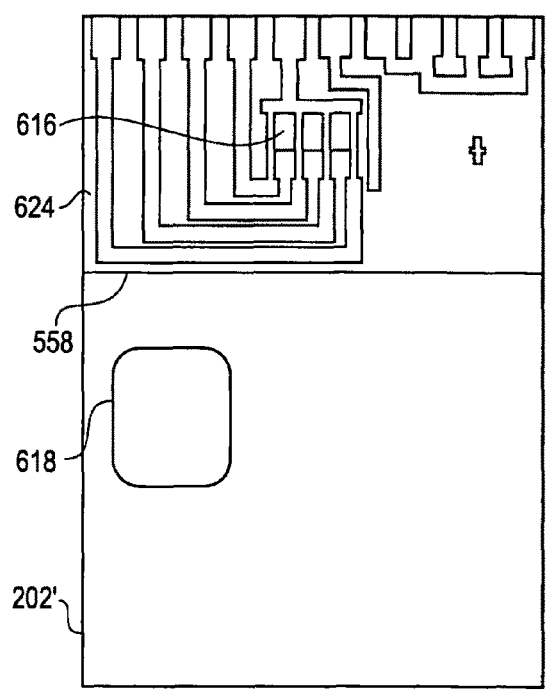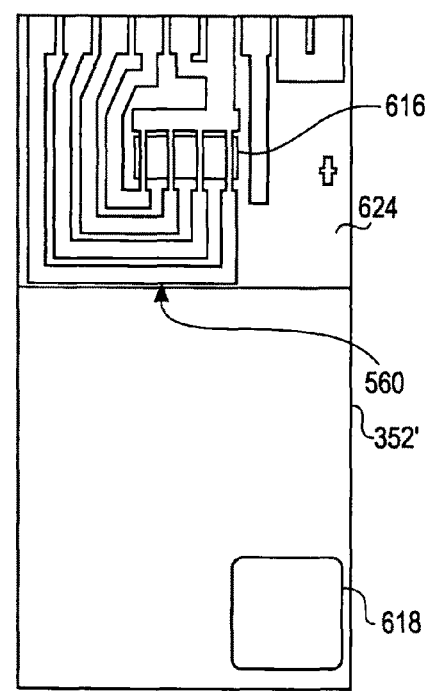

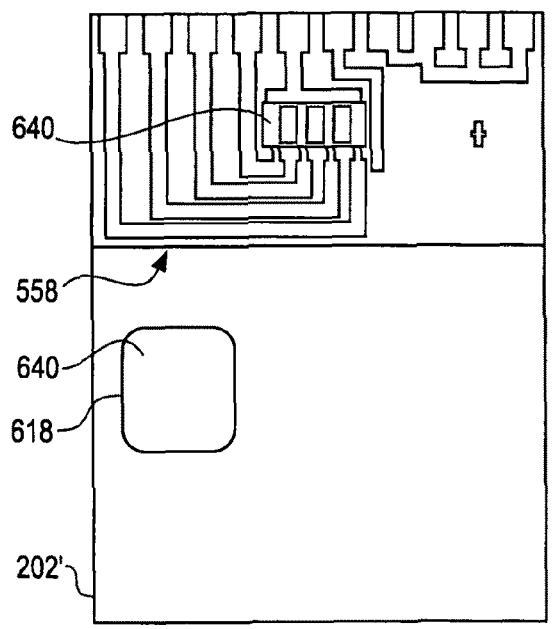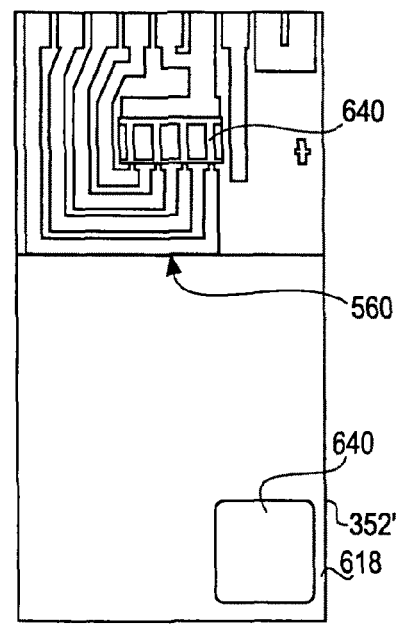

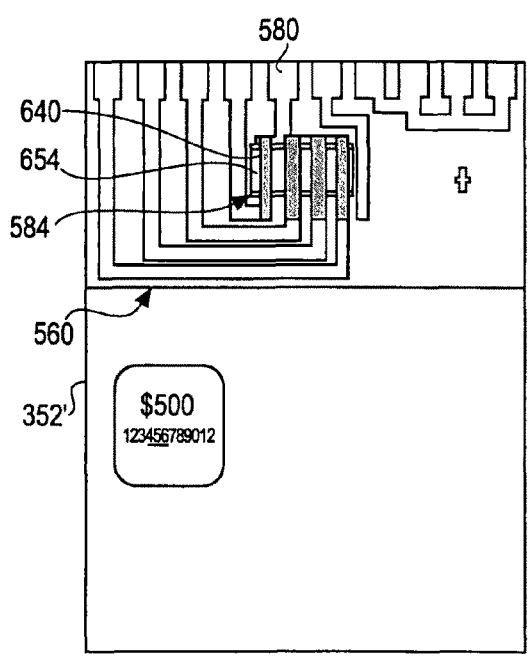
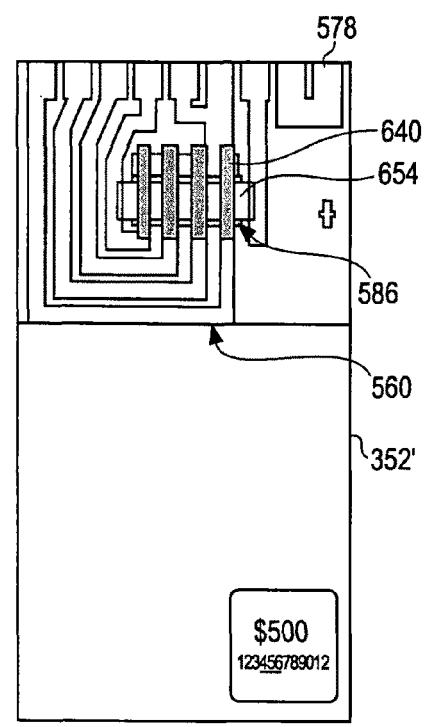

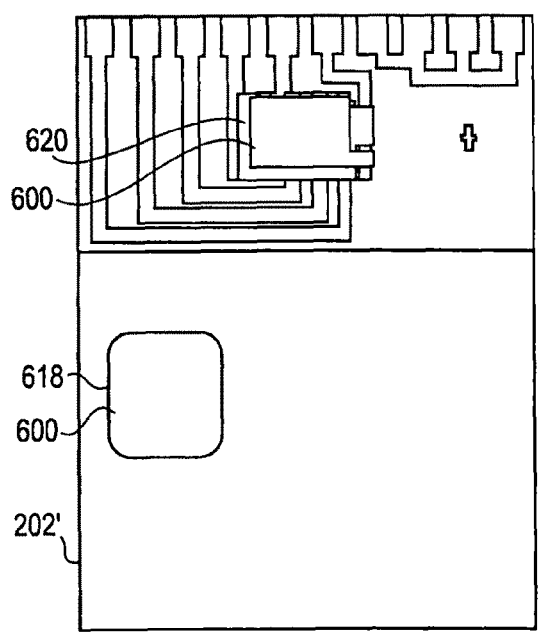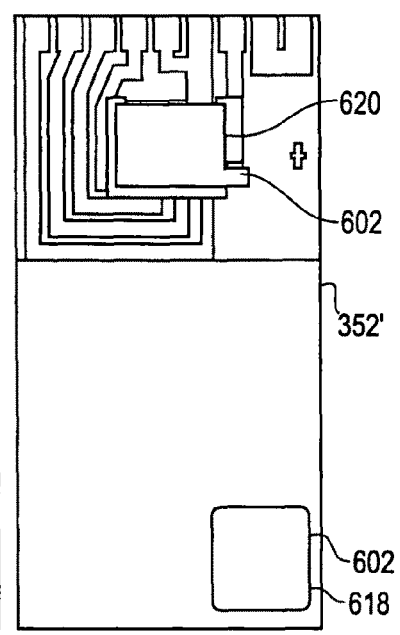

GAME APPARATUS

CROSS-REFERENCE TO RELATED APPLICATIONS

This application claims priority on U.S. Provisional Patent Applications: Ser. No. 60/923,383, filed Apr. 13, 2007; and Ser. No. 60/840,745, filed Aug. 29, 2006.

FIELD OF THE DESCRIBED SYSTEM

The system as described herein generally relates to game and lottery systems, and more particularly to systems using game cards such as instant lottery tickets.

BACKGROUND OF THE DESCRIBED SYSTEM

With respect to lotteries, scratch-off or instant win lottery tickets have been a staple of the lottery industry for decades. They have been enjoyed by billions of players over the world for years. Innovations in instant win ticket game design have sustained the product and allowed for growth. Though, recently the instant win lottery ticket market sales increases have become relatively flat.

One method of combating this undesirable trend is to produce higher payout instant win tickets. However, most lottery jurisdictions regulate payout percentages by charter and therefore cannot utilize higher payout tickets as a means of increasing sales. It is therefore desirable to develop a new methodology of marketing instant win lottery tickets where the player perceives added value independent of increases in payout percentages.

Another method is to expand the distribution of instant tickets to new locations such as super market checkout lanes. However, the logistics and security problems associated with placing instant lottery tickets in super market check out lanes has hitherto made this expanded distribution impractical.

A third method is to enlarge the instant ticket to expand the limited amount of play area, normally termed the scratch-off area to create an extended play experience. Such tickets having larger or multiple play areas, for example Bingo games, do provide for additional play. However as a practical matter, the physical size of a ticket can be increased only by a limited amount. Typically the largest tickets measure 4×10 inches and, at that size, are cumbersome. Also, players often perceive that the added playing time does not reflect the higher cost of larger tickets.

Yet another method is to create a small electronic game device on which an instant lottery type game can be played. In one such device, a game along with a predetermined win outcome for the game is programmed into a microprocessor prior to assembly of the device by connecting ports of the microprocessor to selected tracks on a printed circuit board as described in U.S. Patent Application, Publication No. US 2004/0235550.

SUMMARY OF THE DESCRIPTION

It is one object to describe a player activated game system that overcomes at least some of the disadvantages of the products referenced above.

It is also an object to describe a game card or lottery type ticket along with a method for making same that is suitable for use with the described game system.

BRIEF DESCRIPTION OF THE DRAWINGS

FIG. 8 front view of a second player activated electronic validation machine with an associated game card;

FIG. 9 is a rear view of the electronic validation machine of FIG. 8;

FIG. 10 is a front perspective view of the electronic validation machine of FIGS. 8 and 9 with a game card partially inserted;

FIG. 11 is a exploded view of the electronic validation machine of FIGS. 8 and 9;

FIG. 16 exploded view of a third player activated electronic validation machine with an associated game card;

FIGS. 17A, 17B and 17C are depictions of displays of potential game outcomes displayed by an electronic validation machine of the type shown in FIG. 93;

FIG. 26 is a front view of a fourth player activated game device and an electronic scratch ticket for use therewith;

FIG. 27 is a front view of a fifth player activated game device and an electronic scratch ticket for use therewith;

FIG. 29A and FIG. 29B are schematic diagrams of circuits and a release coat printed on the substrate of the electronic scratch tickets of FIGS. 27 and 26 respectively;

FIG. 30 is a schematic diagram of circuits with a cut in a prize level bit circuit of the electronic scratch ticket of FIG. 26;

FIG. 31A and FIG. 31B are schematic diagrams of circuits and a scratch detection layer printed on the substrate of FIG. 30 is a schematic diagram of circuits with a cut in a prize level bit circuit of the electronic scratch ticket of FIG. 26;

FIG. 32 is a schematic diagram of circuits showing a laser cut line the electronic scratch ticket of FIG. 26;

FIG. 36A and FIG. 36B are schematic diagrams of lower conductive circuits printed on the substrate of the electronic scratch tickets of FIGS. 26 and 27 respectively;

FIG. 37A and FIG. 37B are schematic diagrams of the lower conductive circuits and a primer white mask printed on the substrate of the electronic scratch tickets of FIGS. 26 and 27 respectively;

FIG. 42A and FIG. 42B are schematic diagrams of the conductive circuits including an upper shorting circuit printed on the substrate of the electronic scratch tickets of FIGS. 26 and 27 respectively;

FIG. 44A and FIG. 44B are schematic diagrams of the conductive circuits including scratch detection ink film printed on the substrate of the electronic scratch tickets of FIGS. 26 and 27 respectively;

DETAILED DESCRIPTION

Figure 1:
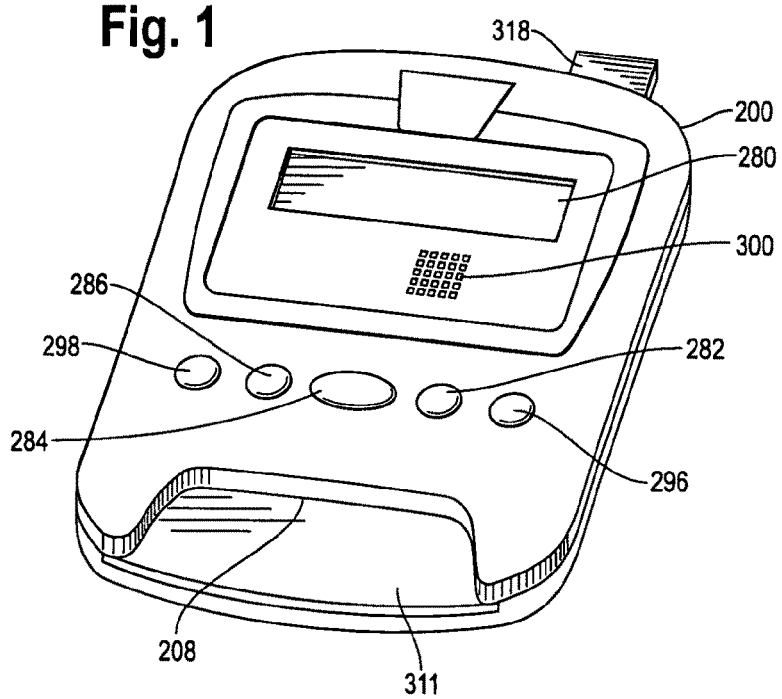
FIG. 1 is a front perspective view of a first player activated electronic validation machine.

FIGS. 1-5 depict a first embodiment of a player activated game system. For simplicity the system described herein reflects one embodiment or application of an overall system concept. For purposes of this description, the exemplary embodiment of FIGS. 1-5 is described in the context of a lottery application. Specifically to illustrate some of the system concepts and components of the system, a game system is described that can play like a conventional instant lottery ticket game that utilizes an electronic game device 200 as a player activated electronic validation machine ("EVM") in combination with game cards formatted as instant lottery tickets. For convenience and consistency of description, the term EVM is used herein even though the EVM might not perform validation functions per se. There are other applications of the system and its components including, for example, coupon and recreational games. This particular embodiment of the system of FIGS. 1-5 includes the EVM 200 shown in FIG. 1 and what is effectively an instant type lottery ticket 202 having a front surface 204 shown in FIG. 2 and a back surface 206 shown in FIG. 3. As an example of one mode in which the system can operate, a player would purchase one or more of the tickets 202; inserts one of the tickets 202 into a ticket receiving slot 208 configured in the EVM 200; and plays a computer type game on the EVM 200 in which the outcome or prize value is predetermined by information contained on the instant ticket 202. Preferably, the player activated EVM 200, is a relatively small, inexpensive electronic device, that can be used in conjunction with printed instant type lottery tickets, such as the ticket 202 and that also can be designed to receive and validate a variety of lottery type tickets such as standard 2"×4" instant lottery ticket.

Figure 4:
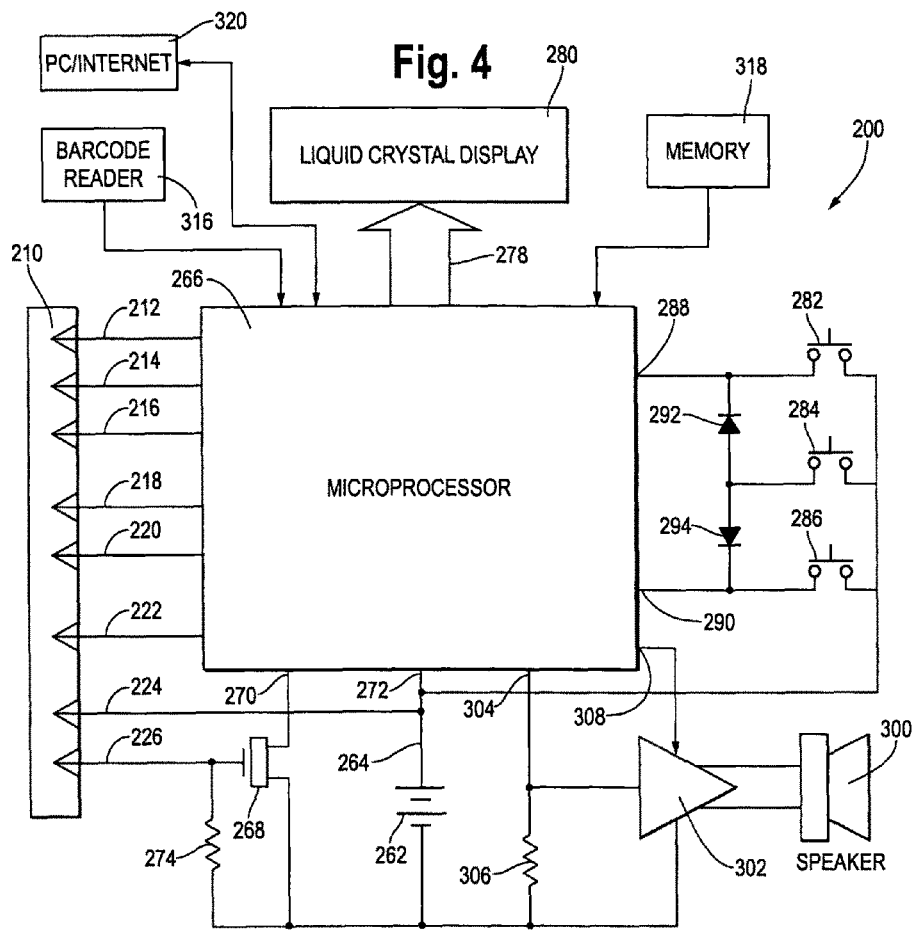
FIG. 4 is a schematic diagram of the components of the electronic validation machine of FIG. 1.
Figure 5:
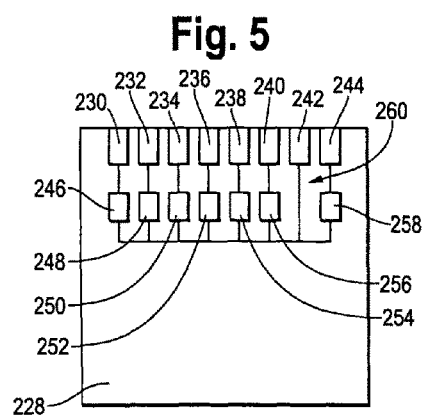
FIG. 5 is a schematic diagram of circuits printed on the substrate of the lottery ticket of FIG. 1.

FIGS. 4 and 5 illustrate in schematic form one of a plurality of possible architectures for the EVM 200 and the lottery ticket 202 respectively. Here, the EVM 200 includes a connector 210 having a set of interface connections or contacts 212-226 to interface with and obtain electronic signatures from the lottery ticket 202. Printed in conductive ink on a substrate 228 of the ticket 202 is a set of eight contacts 230-244 that are configured to interface directly with the contacts 212-226 of the EVM connector 210. In this example of the ticket 202, a set of electrical impedances 246-258 are also printed in conductive ink on the substrate 228 and are connected on the substrate 228 to the contacts 230-244 by a set of printed conductive lines indicated at 260. A variety of methods of printing and the composition of the conductive elements such as 230-244 and 246-258 and the conductive line 260 can be used to print the conductive elements on a substrate. However, because the conductive elements 246-258 will, preferably, vary from ticket to ticket, it might be desirable to use an imaging type printing process such as an inkjet printer to (selectively) print the elements 246-258. In one alternative, printing methods such as flexographic and intaglio, including gravure, can be used to produce sets of tickets 202 having identical conductive elements such as the elements 230-260. Then a high intensity laser can be used be used to (selectively) cut some of the appropriate conductive elements 246-258 so that the information contained in the elements 246-258 corresponds to the information printed in a barcode 310 or a barcode 314 on ticket 202. In one example, the conductive elements 246-258 can be laser cut to reflect the winning amount or prize as specified in the barcode 310 if the ticket 202 is a lottery ticket.

As shown in the example of FIG. 4, the EVM 200 can include a battery 262 connected to the contact 224 via a line 264 and is effective to create the electronic signatures used to transfer information from the ticket 202 to the EVM 200. It will be appreciated, that while the embodiments of the EVM 200 and the ticket 202 contemplate direct physical contact of the contacts 212-226 with the contacts 230-244 on the ticket 202, other types of electrical contacts or signal transmission arrangements can be used such as the techniques described above that include capacitive, inductive, RF or other wireless methods or even in some circumstances an optical contact can be used. The electronic signatures so obtained via the contacts 212-226 can then be used to impart particular information to a microprocessor 266 in the EVM 200. This information can include a wide variety of data such as: the type of game to be played; the predetermined prize level of the game; the status of the ticket 202; the presence or absence of the ticket 202 in the slot 208 as well as other game or ticket parameters as might be required for a specific game or games.

As an example of the operation of the EVM 200, the interface connection 226, when supplied with a predetermined signature, either voltage or current, from the ticket 202 generated in part by the impedance 258, applies a control signal to a Field Effect Transistor ("FET") 268 which, in turn, connects the battery 262 to the a pair of power connections 270 and 272 of the microprocessor 266. In the absence of this electronic signature, the FET 268 is biased to an 'OFF' state by means of a resistor 274 and the microprocessor 266 is disconnected from the power source 262. When the FET 268 is initially turned on, the microprocessor 266 is caused to reset to its initial, power on state. A set of software contained within the microprocessor 266 in this embodiment or in other locations such as an external memory 318 causes the microprocessor 266 to examine several of its input ports that are connected to the contacts 212-222 for electronic signatures. The input ports connected to contacts 218 and 220, for example, examine ticket impedances 252 and 254 for the electronic signatures that determine the type of game represented by the particular ticket 202. In this particular case, because there are two connections to the microprocessor 218 and 220, this example would encode a maximum of 4 games if a binary signature is employed. For a binary signature, the impedances 252 and 254 can be the presence or absence of a resistance. However, significantly more than 4 games can be encoded by using several different discrete values for the impedances 252 and 254. As an example, assume the impedance 252 can have any one of three values: A, B, or C (trinary encoding). Assume also that impedance 254 can have any of these three values. As a result, nine different games can now be represented by the electrical signatures AA, AB, AC, BA, BB, BC, CA, CB, and CC (3×3). In like manner, the EVM contacts 212-216 in combination with the ticket connections 230-234 and impedances 246-250 provide the microprocessor 266 with electronic signatures that can encode a maximum of 8 possible prize levels associated with each of the different game types if a binary encoding technique is employed. The use of trinary encoding would permit a maximum of 27 different prize levels[ibid]

Figure 2:
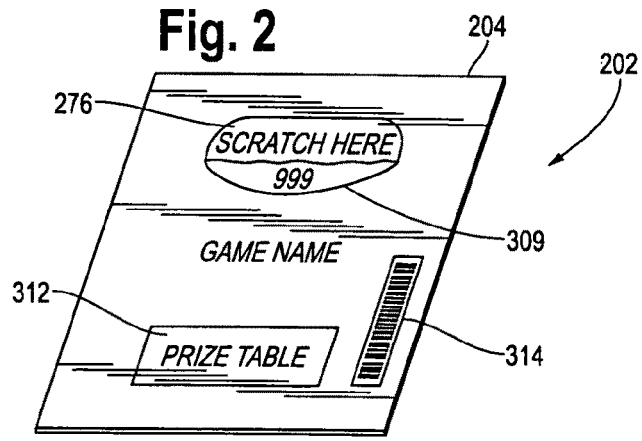
FIG. 2 is a front plan view of a first game card or lottery ticket for use with the electronic validation machine of FIG. 1.

In one of the operations of this particular embodiment, the microprocessor 266 through the contact 222 examines the ticket 202 for the presence of an additional electronic signature produced by the impedance 256. The value of the impedance 256, usually a resistor, can be altered by scratching a scratch-off coating 276 applied over the impedance 256 on the ticket 202 as shown in FIG. 2. This technique permits the microprocessor 266 to determine the status of the ticket 202, that is: whether the ticket 202 is played or unplayed in one embodiment. In this example, the removal of the impedance 256 in effect stigmatizes the ticket 202 so that it cannot be played again. Moreover, it will be appreciated that the use of player-alterable electronic signatures such as impedance 256 has many possible uses including selecting game variables, selecting game types, selecting game play pieces, selecting game branch points, and so forth. In addition, one of the impedances 246-258 can serve as a parity bit that can be, for example, related to the game type or prize level in order to reduce reading errors or possible forgeries of the ticket 202.

In this embodiment, several additional ports of the microprocessor 266 are connected, preferably via a heat sealed flexcable 278, to a liquid crystal display (LCD) 280. This connection can also be made using a Zebra elastomeric connector or a set of mechanical pins. In this example, special LCD drive electronics are built into the microprocessor 266. While there are a number of different displays that can be employed, an LCD is preferred for this example 280 due to low power consumption. Here, the LCD 280 can provide visual feedback to the player by indicating game options, game outcome, total points, games remaining, win/lose results and the like. Likewise, a variety of LCD types are possible including color, monochrome, dot-matrix, 7 segment characters, 16 segment characters, custom characters/icons and any combination and mix of any of the different types.

With reference to FIGS. 1 and 4, it is possible to also include on the EVM 200 a set of pushbuttons 282-286 that can be used by the player to input data to the microprocessor 266 in the process of playing the game(s). In the example shown, a pair of input ports 288 and 290 in combination with pushbuttons 282-286 and a pair of diodes 292 and 294 permit three inputs to the microprocessor 266. As shown in FIG. 4, the pushbuttons 282-286 are all normally open and pull down resistors (not shown) internal to the microprocessor 266 result in logic 0 inputs to ports 288 and 290. Pressing pushbutton 282 connects the anode of the battery 262 to the port 288 and produces a logic 1 input that is subsequently read and decoded by the microprocessor 266 as a player input. In a like manner, pressing pushbutton 286 produces a logic 1 input to port 290. The diodes 292 and 294 produce logic 1 inputs to both ports 288 and 290 simultaneously when pushbutton 284 is pressed. It will be appreciated that the pushbuttons 282-286 can be any one of a number of configurations including but not limited to conductive ink membranes, conductive disks attached to silicone rubber buttons, flexible metal contacts, capacitive pickups, variable resistance contacts, etc. with or without tactile feedback. Moreover, the number of pushbuttons is not limited to three, as indicated by an additional set of pushbuttons 296 and 298 shown in FIG. 1 and can also use binary coding or matrix encoding or variable impedance encoding depending upon the particular design criteria of a game and of the EVM 200.

As shown in FIGS. 1 and 4, a sound capability can be included as an additional feature to the EVM 200. In this embodiment, an audible sound is generated using a loudspeaker 300 in conjunction with a bridge amplifier 302 and an analog signal formed at a port 304 of the microprocessor 266 produces a current signal which develops a voltage across a resistor 306. The analog information is stored as words or bytes of digital data stored in an internal memory of the microprocessor 266 and input to a digital to analog converter also contained in the microprocessor 266. Then the digital to analog converter outputs a current to the port 304 having a value proportional to the digital data. The resistor 306 operates to convert the current to a voltage that is amplified at 302 and applied to the loudspeaker 300. In this embodiment, the amplifier 302 is a bridge type amplifier that produces the sound pressure level from speaker 300. As a further feature a port 308 of the microprocessor 266 can be used to generate a control signal that places the amplifier 302 in a low power standby mode to conserve battery power. This arrangement as described will provide adequate volume and fidelity from the speaker. However, many other sound generating circuits can be used including circuits that employ single ended amplifiers or single transistor amplifiers, or even a direct connection of the 300 speaker to the microprocessor 266. In addition, the embodiment shown does not preclude other methods of producing sound including the use of pulse width modulation signals, computer generated tones or musical sounds, buzzers, piezo devices, or headphones. Likewise the embodiment shown does not imply that sound must be used. It is possible through the use of the port 308 signal to mute the audio just as it is possible to cause the microprocessor 266 to generate no audio signal at the port 304. Further, the microprocessor 266 can be instructed via electronic signatures read from the ticket 202 or input signals from the pushbuttons 282-286 (or 296-298) to mute the audio.

Depending on various circumstances including cost and applications implemented, other modifications of the system shown in FIGS. 1-4 can be made. For instance, the battery 262 can be a non-chargeable or chargeable as well as being user-replaceable or non-replaceable. The microprocessor 266 or its equivalent can use internal or external LCD drive electronics. Likewise, the microprocessor 266 can use internal or external program and data storage memory and the memory can be volatile or non-volatile, one time programmable or many times programmable or physically removable or non removable. In other embodiments, the EVM 200 or microprocessor 266 can contain an external port or ports 320 that permit the memory to be programmed from a personal computer or lottery terminal. The ports can be of the direct connection type or wireless type using RF, current loop, capacitive pickup, or light including infra-red.

Various alternatives, enhancements and operations of the system described above in connection with FIGS. 1-5 are described below. In one embodiment related to an instant lottery type application, the prize information is encoded in the ticket 202 conductive ink jumpers 246-250 generally as described above. In one arrangement, printed under the scratch-off coating 276 is a validation or ticket identification number indicated by a broken line 309 that can be used to validate the ticket 202. Along with initiating operation of the EVM 200 as described above, scratching off the coating 276 can also have the effect of stigmatizing the ticket 202 against further play. For example, and as discussed above the conductive ink forming one or more of the impedances 246-258 can be formed with the scratch-off coating 276 so that at least a portion of it is removed when the coating 276 is scratched off by the player. To facilitate scratching off the coating 276, the EVM can be configured with a planer portion 311 located adjacent to and below the slot 208 so that the portion of the ticket 202 including the scratch-off coating is supported when the ticket 202 is inserted in the slot 208. The process of sensing by the EVM 200 that the scratch-off coating 276 is first intact and then destroyed can serve the dual purpose of both stigmatizing the ticket and protecting against unscrupulous lottery ticket retailers prescreening tickets for high-tier winners.

In addition, the ticket 202 can include a barcode 310 printed on the back surface 206 of the ticket 202 as shown in FIG. 2 or on the back surface 206 of the ticket 202. In this case the barcode 310 includes ticket validation information and can be in the traditional lottery interleaved Two-of-Five (12 of 5) format with an associated validation number. In this embodiment, the barcode 310 is synchronized with the impedances 246-256 so the two agree on the prize amount and can be used to validate the ticket in the event that, in this particular example, the results of a game displayed on the display 280 indicate that the game was a winner as suggested by a prize table 312 printed on the front 204 of the ticket 202. Also, the game play information can be contained in a second, encrypted, barcode 314 for example on the front surface 1204. This play information may include such things as the game to be played, the prize level of the ticket 202, and at least a portion of the validation number. In one application, a bar code reader 316 located in the EVM 200 can read the barcode 314 prior to playing the game encoded in the ticket.

Figure 6:
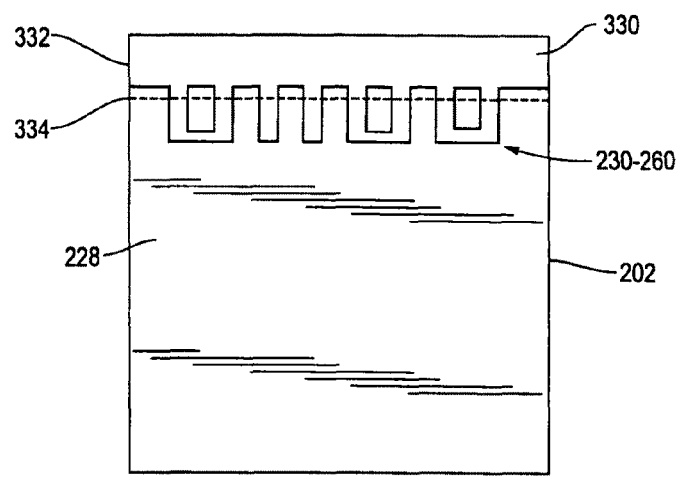
FIG. 6 is a plan view of the substrate of the lottery ticket of FIG. 2 with a first circuit shorting mechanism.

FIG. 6 depicts one configuration of the substrate 228 of the ticket 202 designed to reduce potential fraud including ticket picking. In this embodiment, some or all of the conductive elements 230-260 are connected to a conductive shorting bar 330 that is printed on a perforated tab 332 that is attached to the ticket 202 by a perforation 334. Removal of the tab 332 will allow the player to insert the ticket 202 into the EVM 200 for play.

Figure 7A:
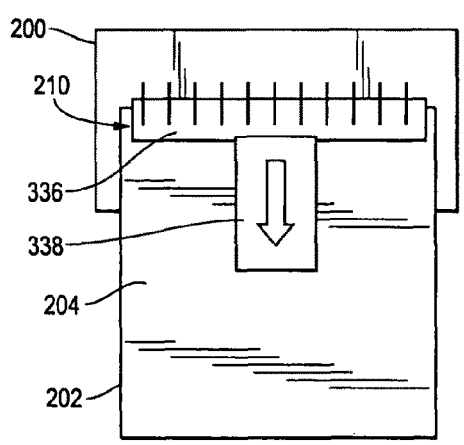
FIGS. 7A and 7B are plan views of the substrate of the lottery ticket of FIG. 2 with a second circuit shorting mechanism.
Figure 7B:
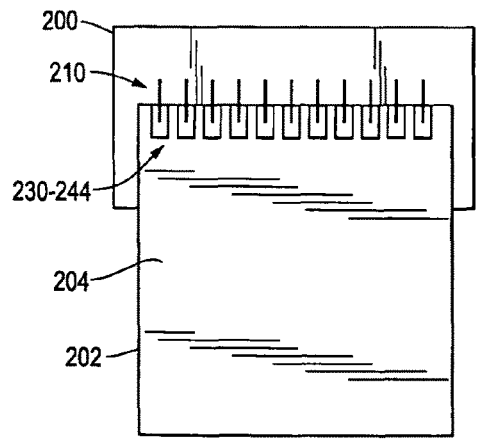

FIGS. 7A and 7B depict another configuration of the ticket 202 designed to reduce potential fraud including ticket picking. In this embodiment, some or all of the EVM's connector or contacts 210 are in contact with a shorting bar 336 having a tab portion 338 where the shorting bar 336 is attached to the surface 204 of the ticket 202. Pulling on the tab 338 will remove the shorting bar 336 resulting in electrical contact between the contacts 210 and 230-244 thereby permitting the ticket 202 to be played.

As a result in an instant lottery type embodiment of the system described above, a player can use the ticket 202 to activate the EVM 200, play a computer style game, and possibly win a prize predetermined by the ticket 202. Preferably, the computer games will have a predetermined outcome or result. By having a predetermined outcome, it makes it possible in lottery applications of the system to construct a prize structure for a particular game or set of games where, for example, books of the tickets 202 are printed with a predetermined number of winners. One of the capabilities of the system is to allow a player to play an interactive game using the push buttons 282-286 and the result of the game will be the same no matter which buttons are pushed. Programming techniques for such illusion of skill type games are well known and described for example in U.S. Pat. No. 4,582,324. Such games as bowling or blackjack can be implemented using this technique. It is also possible to provide additional circuits, some scratchable and some not, located on the ticket 202 that can be used for a variety of functions including starting the game, ending the game, changing the game's play sequence, and even serving as pushbuttons to provide additional control capability.

Due to the fact that this embodiment of the system permits standardized EVM hardware and software manufacturing, all EVM devices 200 can be substantially identical, with the differences in games and play determined by the instant ticket 202. As a result, this embodiment has the advantages of: eliminating the logistical complexity of handling seeded EVMs; reducing the costs of the EVM 200 or electronic cards; and changing the economics of electronic card sales in that one EVM 200 can play several different types of games actuated by multiple different instant tickets 202 thereby in certain applications allowing the EVM 202 to be sold at low cost or even given away. Thus, the player activated EVM 202 and associated custom tickets 202 can build on the instant ticket product by offering dynamic game action and even sound to correspondingly enhance the player experience and perceived value. Moreover, because the game is contained within an electronic memory associated with the EVM 200, the playtime and thus perceived value of the game can be increased far beyond the capability of a standard scratch ticket to support. Instant tickets measuring 3×3 inches, as an example, could produce a game that lasts for several minutes. That feature combined with game graphics displayed on the display 280 and associated EVM sound 'bites' can also make the game a multi-media experience. Winning plays can be announced both visually on the display 280 and audibly on the speaker 300. Additional capabilities can include physically modifying the ticket 202 so as to allow scratching of additional areas on the ticket 202 during game play to add another dimension to the game.

In another embodiment, the use of programmable memory or external memory pods such as a plug-in-memory 318 as depicted in FIGS. 1 and 4 can permit the player to personalize his EVM 200 so that it contains, for example, only preferred game types or prize levels. Contents of the EVM 200 can thus be modified at the point of sale, for example, to include the player's favorite numbers or purchase record, or name and password to provide player allegiance information or provide gifts or coupons based upon the record of purchases. In addition, the multi-media capability of the EVM 200 can also provide an opportunity to display local advertisements or announcements for a player or a region unique parameter.

Also in lottery applications, because the EVM 200 in the embodiment described above is not a gambling device per se, in this case the instant ticket 202 can be considered the gambling component, sales of the device may avoid limitations associated with standard lottery tickets. For example, the EVM 200 can be sold anywhere containing only conventional games of skill such as the video game Tetris and the owner can then purchase instant tickets 202 at the conventional lottery outlet to play gambling style games. This characteristic of the EVM 200 permits downloading games from a personal computer 320 or over the Internet, for example.

Furthermore, specially programmed tickets or cards 202 can be used to provide an activation code for the EVM 200. For example, an activation card can include a barcode such as the barcode 310 containing an encrypted activation code. The barcode 310 would be read and decrypted at the point of sale and used to generate a sales slip containing a multi-digit activation key, which is synchronized with the card 202. When the activation card 202 is inserted into the slot 208 of the EVM 200, the information contained on the activation card 202 is read by the EVM 200 and used, as a key to determine if the activation key data entered by an EVM keypad is correct. Theft of EVMs 200 would thus be discouraged since the stolen unit would not function without the sales receipt.

FIGS. 8-12 illustrate another embodiment of a player activated game system. In the preferred structure of this embodiment, an EVM 350 is configured with an upper printed surface 352 that, in this case, replicates a traditional game card or lottery ticket. The EVM 350 includes a housing 354, a bottom portion 356 and a pair of guide members 358 and 360 for receiving and retaining the ticket 352 within the EVM 350. In some applications the ticket 352 can be purchased separately from the EVM 350 and inserted by a player or the EVM 350 and ticket 352 can be sold as an assembled unit. In any event, the EVM 350 can also include a display 362, preferably an LCD display unit, and with particular reference to FIGS. 10 and 11, a printed circuit board 364 secured to the bottom portion 356. Integrated with the circuit board 364 is a microprocessor or computer, indicated by 366 in FIGS. 11 and 12, operatively connected to the display 362 by any convenient method such as a flexcable 368. A battery 370 is provided to supply power to the EVM 350. In this embodiment, a pressure sensitive switch indicated at 372 is also integrated into the circuit board 364. In the preferred embodiment, the switch 372 includes conductive carbon applied to a plastic membrane located above the circuit board 364 that is effective to complete a circuit between the battery 370 and the microprocessor 366 although other types of switches can be used including the FET 1268. In this particular embodiment, the ticket 352 includes a scratch-off coating 374 applied over a set of indicia 376 printed on the ticket 352. Here, the player following the printed instructions on the scratch-off coating "SCRATCH TO PLAY" removes the coating 374 and pushes where indicated by the indicia 376 which can have the effect of applying power to the microprocessor 366. This type of arrangement including the switch 372 can also be used to control the game or games programmed in the microprocessor 366. Other mechanisms can also be used to activate the EVM 350 including a pull-tab arrangement 394 of the type described in connection with FIG. 16.

Similarly to the ticket 202 shown in FIG. 5, the ticket 352 preferably includes a set of printed circuit elements of the type 230-260 and generally indicated at 378 in FIG. 11 in phantom form. In this embodiment of the system including the EVM 350 and the ticket 352, the printed elements 378 are used to represent a predetermined prize level and other information in the same manner as the circuit elements 230-260 printed on the ticket 202 described above.

Figure 12:
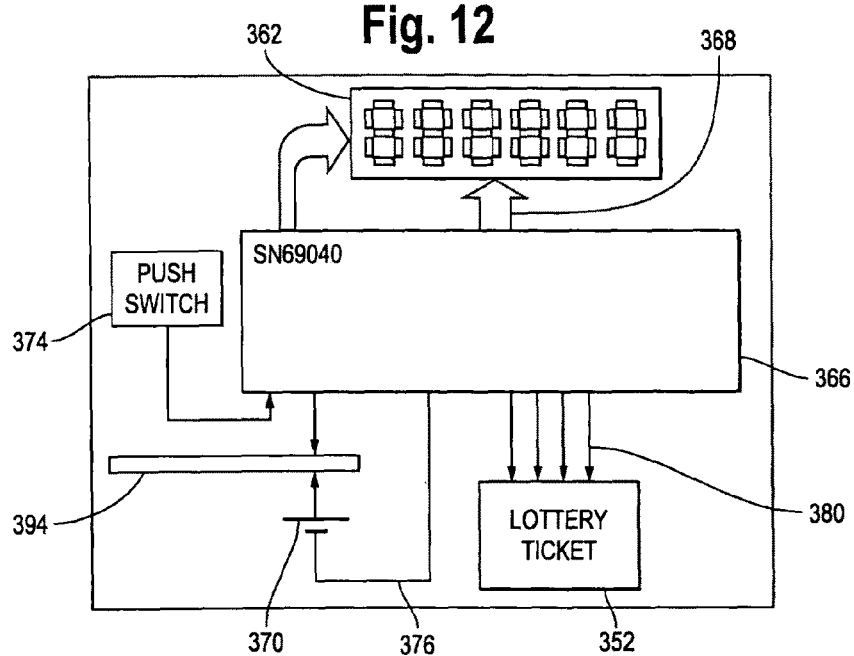
FIG. 12 a block diagram of the components of the electronic validation machine of FIG. 8.

As shown in FIGS. 11 and 12, in order to provide an electrical connection of the circuit elements 378 to the microprocessor 366, a set of connector pins 380 is secured to the circuit board 364 and electrically connected to the microprocessor 366. When the ticket 352 is fully inserted or positioned in the EVM 350 as shown in FIG. 8, the pins 380 will make electrical connections with the circuit elements 378 thereby permitting the information contained in the circuit elements 378 to be transmitted to the microprocessor.

Figure 13:
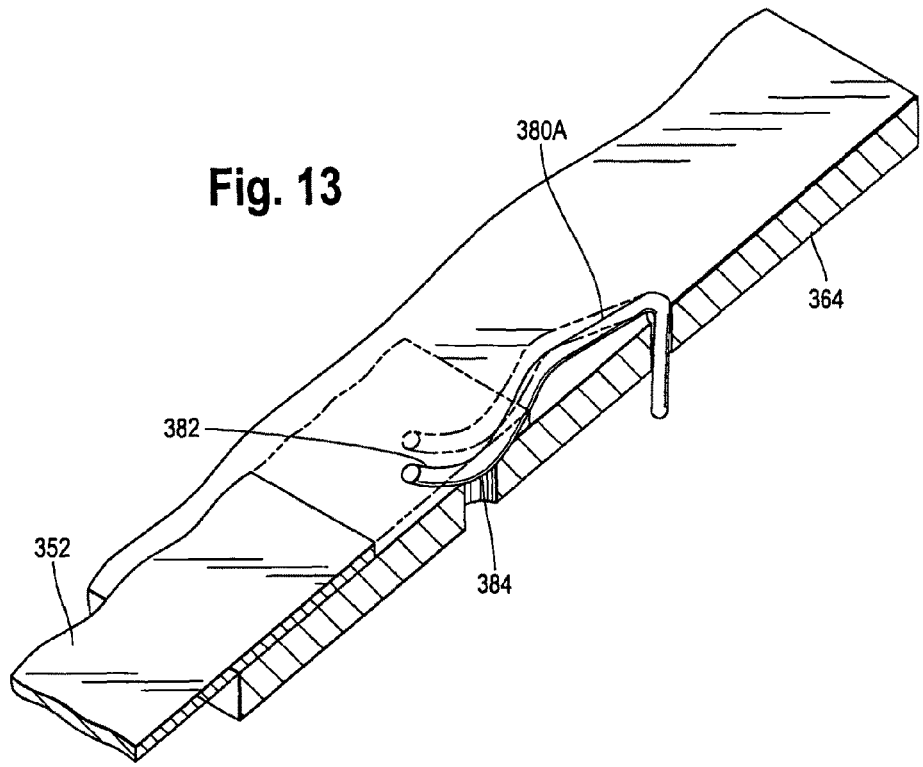
FIG. 13 is a side view of a first spring connecter for use with an electronic validation machine of the type shown in FIG. 8.
Figure 14:
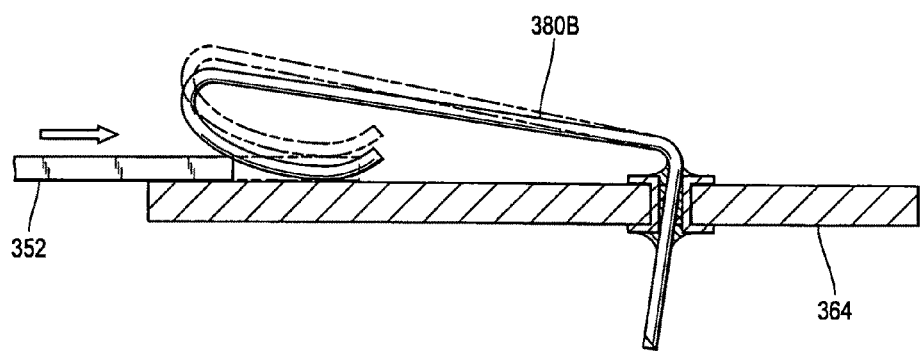
FIG. 14 is a side view of a second spring connecter for use with an electronic validation machine of the type shown in FIG. 8.
Figure 15:
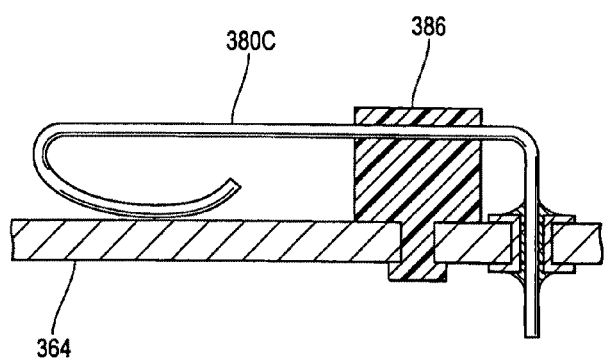
FIG. 15 is a side view of a third spring connecter for use with an electronic validation machine of the type shown in FIG. 8.

FIGS. 13, 14 and 15 illustrate embodiments of the pins 380. In one embodiment of the pins 380 shown in FIG. 13, an example of a pin 380A is configured with a curved portion 382 with a lower portion that normally resides in a hole or other indentation 384 configured in the circuit board 364. In this arrangement, the pins 380A due to a biasing or spring action are additionally effective to retain the ticket 352 in the EVM 350 and at the same time to permit insertion of the tickets 352 into the EVM 350 either at the time of manufacture or by a player. To increase the biasing force retaining the ticket 352 in the desired position on the circuit board 364, the angle between the portion of the pin 380A inserted in the circuit board 364 and the portion connected to the curved portion 382 is preferably 90 degrees or less. In a second embodiment depicted in FIG. 14, one end of a pin 380B is inserted at an angle into the circuit board 364 and the other end is curved downwardly to provide a retaining force on the ticket 352. In a third embodiment a pin 380C is shown in FIG. 15 which is similar to the pin configuration 380B. In this embodiment, however, the pin 380C extends perpendicularly through the circuit board 364. To aid in retaining and aligning the pins 380C on the circuit board 364, the pins are secured together by a plastic alignment strip 386.

Another aspect of the EVM 350 as depicted in FIGS. 8-10 is that the EVM 350 can be configured with an aperture 388 in the bottom portion 356 of the housing 354. In this embodiment, the aperture 388 is in registry with a barcode 390 printed on the bottom surface of the ticket 352. Here, the barcode 390 can contain validation and inventory information much like a conventional instant lottery ticket. Preferably, the barcode 390 will include information relating to the prize value of the ticket 352 and thus it will be functionally related to the information contained in the conductive elements 378. Thus for instance, a lottery agent using an agent terminal can validate a winning game programmed on the ticket 1352 in the same manner as a conventional instant lottery ticket.

FIG. 16 illustrates a further embodiment of a player activated game system. This embodiment can include several of the same basic components as the embodiment shown in FIG. 11 such as the display 362, the printed circuit board 364, the microprocessor 366, the cable 368, the battery 370, the player operated (carbon) switch 372, and the contact pins 380, that in this embodiment are contained in a housing 390, preferably formed from plastic. As with the housing 354, the housing 390 can include an aperture 392 for reading a barcode printed on a game card. In this embodiment, a pull tab 394 can be used to connect the battery 370 to the microprocessor 366 as illustrated in the block diagram of FIG. 12. Secured over the components 362-372, 380 and 394 is a printed game identification card 396. In this embodiment that replicates in form a conventional instant lottery ticket, the identification card 396 includes a pay table 398 and a printed push button 400 located over the switch 372. In addition, this example of the identification card 396 is configured with three apertures or windows 402A-402C located in registry with the display 362 such that the results of the game programmed in the microprocessor 366 can be observed by the player. Preferably, the identification card 1396 is printed on a paper substrate in the same manner as a conventional instant lottery ticket but other materials can be used such as plastic to form the identification card 1396. To program this embodiment with a predetermined result or payout according to, for example, the pay table 398, a programming card 404, preferably printed with electronic circuit elements such as the elements 230-260, can be inserted into a slot 406 in the housing 390 where the contact pins 380 will make contact with the contacts 230-244 printed on the card 404. In one lottery application of the embodiment shown in FIG. 16, the basic machine including the housing 390, the printed circuit board 364 and the microprocessor 366 programmed with one or more games can be mass produced in one location. Then sets of the programming cards 404 can be printed in another location where, for instance, each set or book of the cards 404 defines a prize structure for a particular lottery game.

There are a number of different types of displays that can be used with the EVMs described above. FIGS. 17A-17C provide a graphic illustration of one type of display 280 or 362 for one of many types of games that can be played on the various embodiments of the player activated game systems shown in FIGS. 2-16. In this example which replicates a standard casino type slot machine, the display 362 is an LCD having a total of 35 display elements where 12 elements indicated generally at 408 can be used to display several varieties of fruit (banana, apple, orange, cherry, lemon) which in FIG. 17A are three apples. Another 21 display elements indicated generally at 410 can be used to display three numerical digits and a pair of display elements 412 and 414 can be used to display a "WIN" display and a "TOTAL" display respectively. The slot machine game can be implemented on, for example, the embodiment shown in FIG. 16 where, as indicted on the game identification card 396, the game unit or lottery ticket of FIG. 16 can be purchased for $25.00 and each simulated handle pull in the game is equivalent to $1.00 thus giving the player a simulated twenty handle pulls. After applying power to the microprocessor 366 and LCD display 362 by removing the pull tab 394, the player can use the carbon switch 372 to, in effect, pull the handle of the slot machine. As shown in FIG. 17B, one outcome of the game can be three bananas displayed on the elements 408 with the digits 410 indicating that these symbols are worth $100. Another outcome is shown in FIG. 17C where three different types of fruit are displayed by the elements 408 and the digits 410 indicate that the value of this pull is zero. Although not shown, the TOTAL display 414 can be used by the microprocessor 366 to periodically display on the digits 410 the cumulative total of the wins and after twenty such pulls can display the total or winning value of the game. In the preferred embodiment of this game as well as other multiplay games, at least one winning pull or play is programmed into each programming card 404 so as to enhance player interest. Also, to maintain player interest, the game programmed in the microprocessor 366 can use a random shuffle seed to randomize losing pulls or other game outcomes so that it does not appear to players purchasing multiple game systems of the type shown in FIGS. 1-16 that all the games are programmed the same way. There are a plurality of methods that may be used to generate the random seed. One such method comprises counting clock pulses in an accumulator starting with removal of the pull-tab 394 and ending with the first depression of the carbon button 372.

As a result, by using programming cards of the type 404 or tickets of the type 202 and 352, it is possible to manufacture a large number of identical electronic game playing devices, yet structure the outcomes of the games, that will appear to the players to be random, into a predetermined prize structure.

Described below is another embodiment of the method and system for playing an interactive lottery type game of the type described above that includes a gaming piece (e.g., a lottery ticket, ticket, card, token) that contains a pre-determined code (activation or prize code) used to establish the outcome of the game and a validation machine (i.e., microprocessor based electronic device or Internet) used to play the game. The activation code is entered manually or automatically into the validation machine where it is used to control the game sequence and (in some cases) the final outcome. In this embodiment, although the game outcome resulting from the aforementioned code is not readily apparent by viewing the code, the gaming piece and or validation machine do contain a mechanism whereby the player can readily ascertain the final result without playing any portion of the game.

This embodiment relates to stationary or portable electronic devices of the type described above which can be used in conjunction with on-line or instant-win (i.e., scratch) lottery tickets to provide entertaining, multi-media games of chance. In particular, this embodiment relates to a system for the administration and playing of an electronic game in which a player acquires a chance (i.e., lottery ticket) to win a monetary or other prize (e.g., additional chances to win). Information contained in or on the lottery ticket is entered manually or automatically into the Validation Machine (VM) where it controls the operation of the VM and produces a pre-ordained prize level.

In certain of these types of systems, as illustrated in Kaye U.S. Pat. No. 5,569,082, problems can occur because the gamepieces associated with such games contain only an encrypted code or are otherwise unrecognizable to the player. Thus the holder of the gamepiece cannot know the prize amount without playing the associated game. One undesirable characteristic of such a system is the natural tendency of the player to forget which, if any, of a set of tickets won a prize. In this case, players might not find enjoyment in spending up to several minutes replaying a used gamepiece to verify its value.

An undesirable side effect of this characteristic is the increased probability of non-winning tickets (i.e., gamepieces) being submitted to lottery retailers for validation. These troublesome tickets may be found lying about unclaimed, may be the result of legitimate players not separating winning tickets from losing ones, and may be the result of damaged tickets that do not contain a complete activation code. Retailers typically receive small compensation for lottery sales and avoid products that are overly labor intensive. As a result, in certain applications it may be desirable to have a system that overcomes these problems.

Therefore this embodiment provides a method for allowing a player to ascertain the prize level of a given activation code without playing the associated game as described below.

Figure 18:
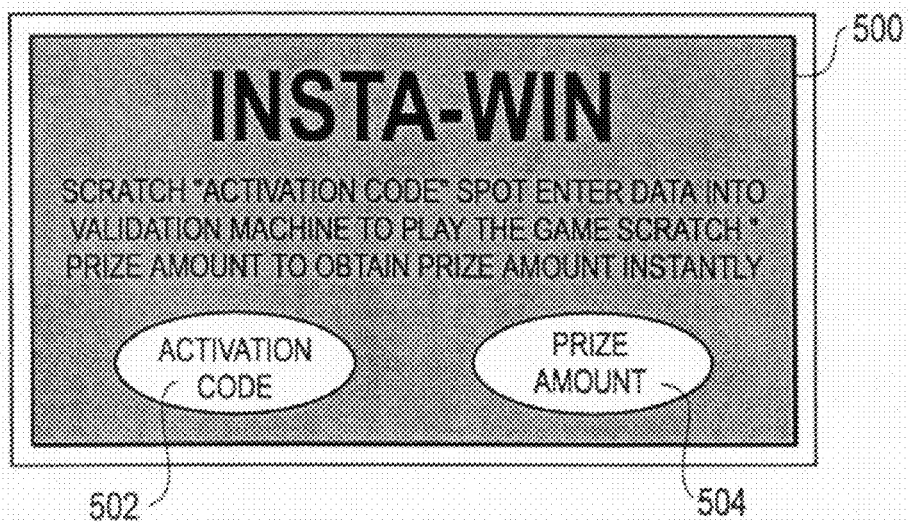
FIG. 18 is a diagram of an lottery ticket or game piece for use with an electronic validation machine having a scratch-off coating covering an activation code and a prize amount.

FIG. 18 is a diagram of an Instant-Win (scratch) lottery ticket 500 embodiment of the invention. A Scratch spot 502, when removed by a player, displays the activation code. The player can simply enter this code into the Electronic Validation Machine (VM) and play the game to its conclusion to obtain the prize amount as described in the embodiments above. In this case, the scratch spot 504 when removed displays the final prize amount. The decision to remove the prize amount spot and when to remove it is left to the discretion of the player.

Figure 19:
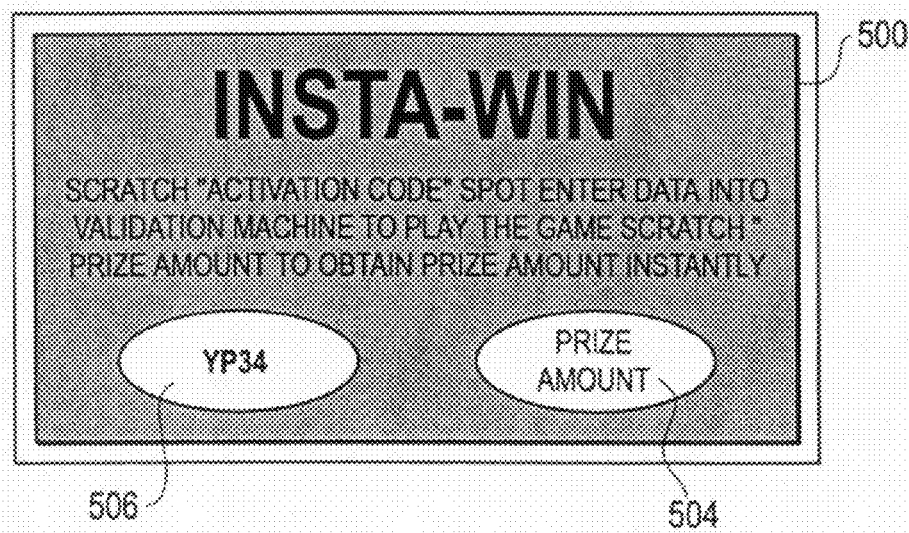
FIG. 19 is a diagram of an lottery ticket or game piece of FIG. 18 with the scratch-off coating covering activation code removed.
Figure 20:
FIG. 20 is a diagram of an lottery ticket or game piece for use with an electronic validation machine having the scratch-off coating covering an prize amount removed.

FIGS. 19 and 20 show an example of an activation code 506 which might be displayed when spot 502 is scratched. An example of the actual prize amount 508 is shown in FIG. 20 The scratch areas 502 and 504 of the ticket 500 are printed using well-known processes and methods typically employed in the industry for the production of Instant-Win lottery tickets. As such, the information hidden below the scratchable surface is highly secure and cannot be determined by using readily available methods or technologies.

Figure 21:
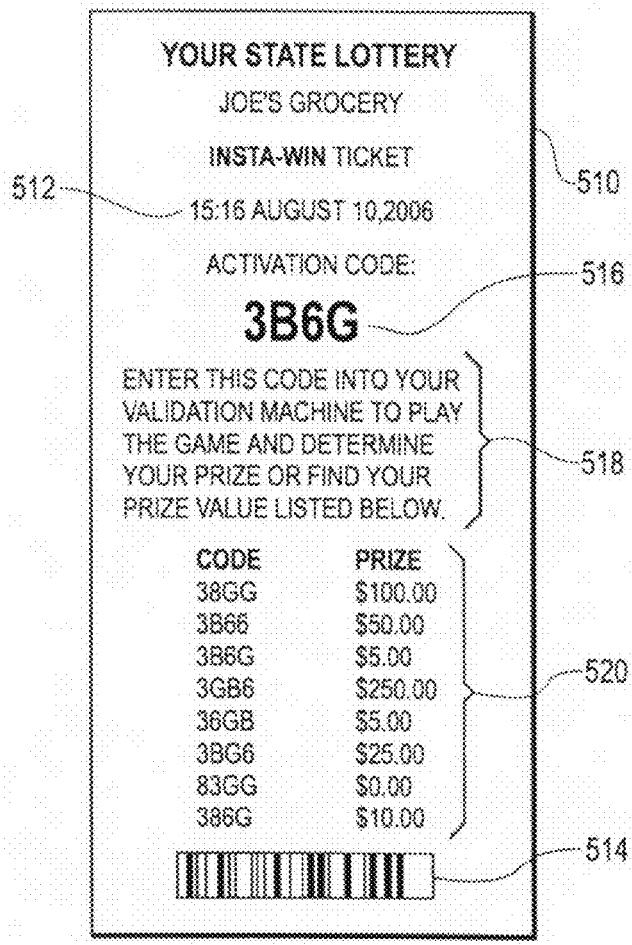
FIG. 21 is a diagram of a on-line lottery ticket.

FIG. 21 shows a typical on-line lottery ticket 510 that can be played on an VM. These tickets are printed at the time of sale. They typically contain Time and Date information 512 as well as encrypted data in a barcode format 514 created by the lottery host computer. In this example, an activation code 516 is clearly printed in the center of the ticket. A set of in instructions 518 for use of the code clearly indicate that the player can also determine the prize amount by matching the activation code 516 with the prize level in the following section 520 of the ticket. In this embodiment, the player simply has to find the activation code 516 in the list of several similar codes 520 and read the prize amount adjacent to that code. Presumably the player will avoid looking at the decoded prize value until he has played the game. On the other hand, there clearly is nothing to prevent him from determining the prize level immediately upon purchase of the ticket.

Figure 22:
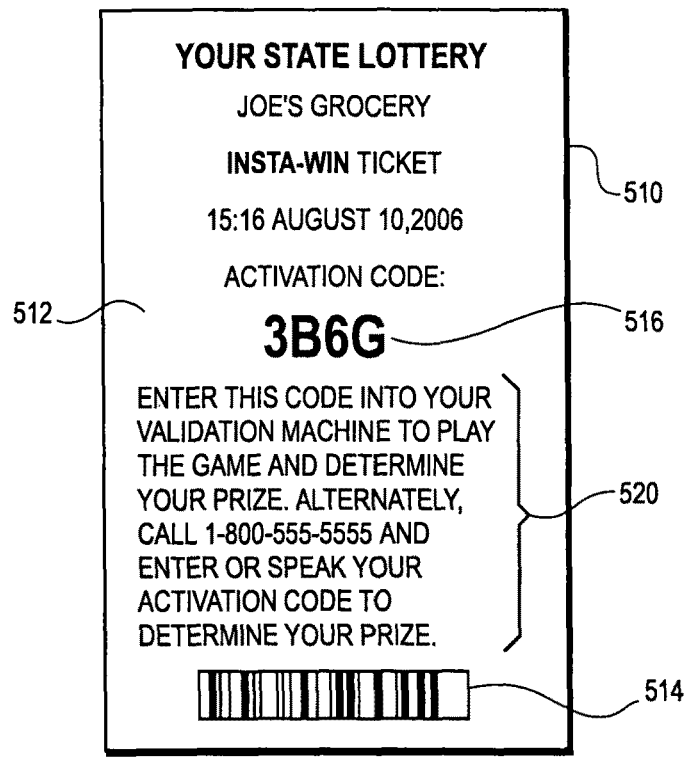
FIG. 22 depicts another embodiment of the ticket of FIG. 21.

FIG. 22 depicts another embodiment of a ticket 510 where the player is directed in a set of in instructions 520 to call an automated phone service. The player will be further directed by the service to enter his activation code from the telephone keypad or say his number into the mouthpiece of the telephone. The computerized phone service can use well-known industry techniques to accept the player's data and decrypt the activation code 516 and announce the prize value to the player.

Figure 23:
FIG. 23 shows a further embodiment of the ticket of FIG. 21.

FIG. 23 shows a further embodiment of the ticket 510. Here the player is directed by the instructions 520 to log on to a lottery specific web site where he enters the activation code via a computer keyboard or other standard input device, and receives the prize amount on his computer monitor or other standard output device.

In another approach, the Validation Machine (VM) such as 200 or 350 described above can offer the player the option to immediately discover the prize amount. In this embodiment, the player enters the activation code into the VM using any of a variety of methods both manual and automatic. Once the code has been entered, the VM will, as an example, immediately offer the player the option of A) Playing the game or B) Obtaining the final prize amount. The player selects the desired option using the usual input devices (e.g., keypad, touchscreen, stylus, pushbutton, etc.). As an optional method, the chance to obtain the final prize amount can be made available to the player at any point throughout the entire game.

In yet another embodiment, the gamepiece such as the ticket 204 can be inserted into or automatically read by a Validation Machine such as the EVM 200 using any of a variety of methods including but not limited to barcodes, printed conductive traces on the gamepiece, optical scanning, RF, magnetic, or capacitive coupling. In these cases, the gamepiece contains an element that can be modified by the player. Examples of such elements include but are not limited to A) opaque sections of instant-win tickets that become translucent or transparent when a scratch-off coating is removed, B) Conductive links printed on an instant win ticket that become non-conductive when scratched, C) Corners or other sections of the ticket that can be torn or cut off the ticket, D) Boxes on the ticket that can be filled with a marker, etc. The VM ascertains the state of this element when the gamepiece code is read and either plays the game or announces the prize value depending upon the specific case and state of the element.

Figure 24:
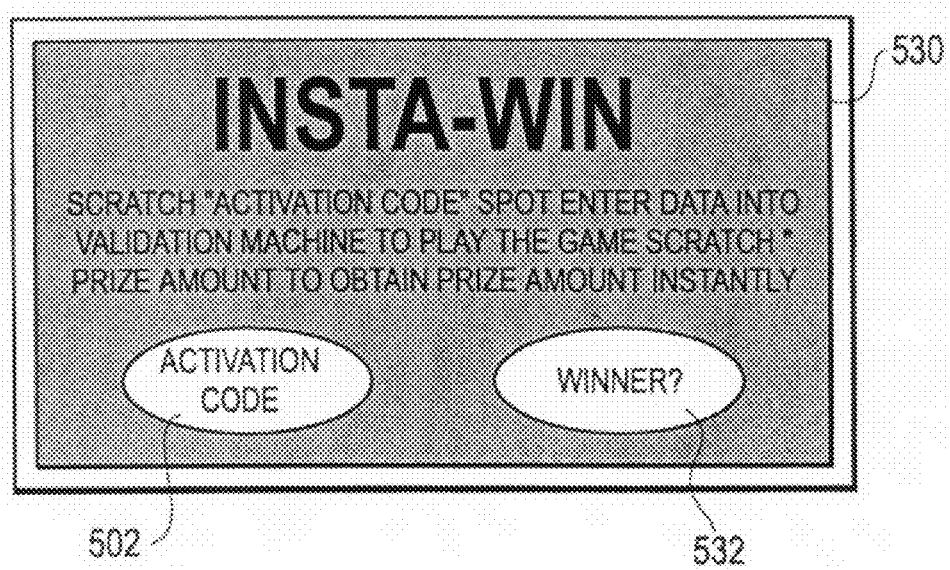
FIG. 24 is a diagram of an lottery ticket or game piece for use with an electronic validation machine having a scratch-off coating covering an activation code and indicia indicating if the ticket is a winner.
Figure 25:
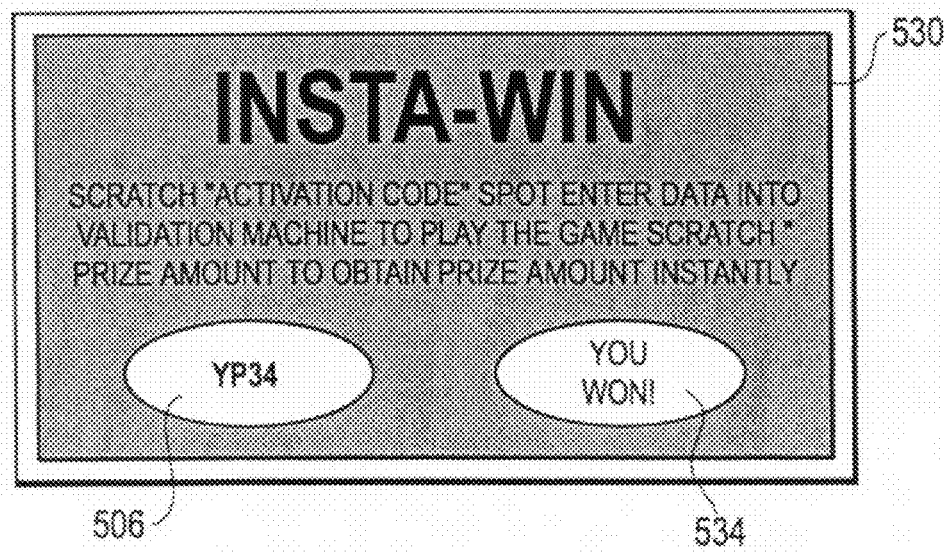
FIG. 25 is a diagram of an lottery ticket or game piece of FIG. 24 with the scratch-off coating covering winner indicia removed.

FIGS. 24 and 25 illustrate a variation of the above embodiment where a ticket 530 includes the scratch-off coating 502 covering the activation code 506 but instead of the winning amount 508 under the scratch-off coating 504 of the ticket 500, a scratch-off coating 532 covers indicia 534 indicating whether or not the ticket 530 is a winner. Thus, the player can immediately recognize if the ticket 530 is a winner. If the ticket is a winner, then the player can scratch-off the coating 502 to access the activation code 506 and play the game on the VM to determine the winning amount.

With reference to the EVM 200 shown in FIGS. 1-5 as well as the type of machine described in U.S. Patent Application, Publication No. US 2004/0235550, still another embodiment of a game apparatus and ticket can be implemented. Taking the EVM 200 as an environment in which to implement this embodiment, the microprocessor 266 can be programmed with a computer type game in which just the prize value is predetermined by information contained on the instant ticket 202. However in this embodiment, the microprocessor 266 is also programmed so as to select only a portion of the tickets 202 as winners. For example, the microprocessor 266 can include a random number generator that would select only a portion of the tickets 202 inserted into the EVM 200 as winners. The prize structure of the game can then be adjusted to take into account that only a portion of the tickets 202 that are encoded with winning amounts would be actually be a winner. Utilizing this approach it would also be possible to construct a prize structure such that every ticket 202 is a potential winner. This would be analogues to a conventional probability type lottery ticket where every ticket is a potential winner depending on how the ticket is played. Alternatively, a prize structure can be constructed such that every lottery ticket is a winner wherein the amounts for the lower prizes would be low enough such that the game itself would be profitable.

A modification of the embodiment described directly above includes playing the game on the validation machine such as the EVM 200 first and then entering the activation code 506 into the EVM 200 or the EVM 200 is programmed to read the prize code from the lottery ticket 530 in order to display the amount of the prize won if any. It is also possible to program the EVM such that the outcome of the game is displayed first, e.g., "YOU WIN'" and then call for the prize code such as 506 to be loaded into the EVM 200 to be displayed.

FIGS. 26-51 illustrate a first embodiment of a structure along with a method for printing or implementing game cards or tickets of the types 202, 352, 404 and 500 that can be used with the electronic game devices or EVMs 200' and 350' as described above in connection with FIGS. 1-25. It should be understood that the concepts, either in whole or in part, as described below can be applied to the manufacture of game cards and lottery tickets suitable for use with game devices of the type described above as well as other devices that might utilize information stored on cards or other media in conductive elements.

For ease and convenience of understanding, the instant tickets will be referred to below as EST tickets (indicating Electronic Scratch Tickets.) A larger EST ticket 202' suitable for use with EVMs of the type 200 will be referred to as Game Device 1 (GD1) tickets and a smaller EST ticket 352' suitable for use with EVMs of the type 350 will be referred to as Game Device 2 (GD2) tickets. Also, to aid in understanding the following table is provided:

TABLE 1

Acronyms, Abbreviations, & Definitions

| Term | Definition |
| --- | --- |
| AC | Alternating Current |
| Activation Key | A special scratch-off area on the EST that the player must scratch to activate the player. Its function, in the described embodiments, is to provide an indication that the ticket has not already been played and that the security shorting (USC) layer is destroyed before a game begins. |
| a.k.a | Also Known As |
| ANSI | American National Standards Institute |
| BCM | Billion Cubic Microns |
| ° C. | Degrees Celsius |
| cm | Centimeter |
| CMYK | (Cyan Magenta Yellow blacK) The color space typically used for commercial printing and most color computer printers |
| DC | Direct Current |
| e.g. | Latin: Exempli gratia - for example |
| EST | Electronic Scratch Ticket |
| Etc. | et cetera '-Latin: from et 'and' and cetera 'the rest' |
| ° F. | Degrees Fahrenheit |
| GD1 | Game Device of a larger configuration such as the EVM 200 of FIG. 1 |
| GD2 | Game Device of a small configuration such as the EVM 350 of FIG. 2 |
| GND | Abbreviation for electrical ground |
| I-2-of-5 | Interleaved two of five - a one-dimensional bar code standard |

TABLE 1-continued

Acronyms, Abbreviations, & Definitions

| Term | Definition |
| --- | --- |
| Ibid. | Latin: Ibidem - in the same place, same as previous reference |
| i.e. | Latin: Id est - that is |
| IR | Infrared |
| JGL | John Galt Line |
| Laser | Light Amplification through Stimulated Emission of Radiation |
| Latex | Alternate term for SOC |
| LBB | Lower Blocking Black - a blank ink film applied to scratch-off tickets to impart optical opacity to the secure areas |
| LCC | Lower Conducting Circuitry |
| LCB | Lower Conductive Black |
| LCD | Liquid Crystal Display |
| LED | Light Emitting Diode |
| LSM | Laser Synchronization Marks - marks printed on the EST, in the described embodiment, to enable a laser to fires at a desired time. |
| LTM | Laser Trigger Marks - marks imaged on the EST, in the described embodiment, which correspond to the prize value of the EST and that in conjunction with the LSMs cause the laser to fire. |
| mm | Millimeter |
| nano | 1) One billionth - i.e., $10^{-9}$ |
| pH | Measure of the acidity or alkalinity of a substance, such as the solution used to develop film. The measurement range goes from 0 (acidic) to 14 (alkaline), with pH 7 being neutral. |
| QA | Quality Assurance |
| SOC | Scratch-Off-Coating |
| Square or ◻ | When length and width of a conductive ink film are equal, the resistor is termed one square ( ✶ ) and its resistance is equal to the sheet resistivity of the ink. |
| Substrate | The stock upon which the ticket is printed. |
| Scratch Detection | A term used to denote a conductive ink film that is applied over the release coat to provide both opacity and an indication to the GD1/GD2 player that the Activation Key scratch-off area has been removed. |
| USC | Upper Shorting Circuitry |
| UV | Ultraviolet |
| V+ | Positive Voltage |
| VAC | Volts Alternating Current |
| VIRN | Void If Removed Number - an industry term for a security number hidden under the scratch-off coating of a lottery ticket |
| W | Watt - unit of power |
| Web | The paper roll threaded (and processed) through the printing press |
| Zahn | A Zahn cup is a viscosity measurement device widely used in the printing industry |
| > | Greater than |
| ≧ | Greater than or equal to |
| < | Less than |
| ≦ | Less than or equal to |
| ± | Plus or minus |
| ≈ | Approximately equal to |
| μ | Greek letter "Mu" - one millionth, i.e., $10^{-6}$ |
| Ω | Greek letter "Omega" - Ohm (unit of electrical resistance) |

As shown in FIGS. 26 and 27, the EST indicated at 202' in FIG. 26 is a larger game ticket that is of the same general type as ticket 202 depicted in FIG. 1 that is adapted for use with a GD1, indicated at 200' in FIG. 26, which is of the same general type of game device as the EVM 200 of FIG. 1. Similarly, the EST indicated at 352' in FIG. 27 is a smaller game ticket and is of the same general type as the ticket 202 depicted in FIG. 1. Here, the EST 202' is adapted for use with a GD2 indicated at 350' in FIG. 27 which is of the same general type of game device as the EVM 350 of FIG. 8. As described above, the ESTs 202' and 352' electronically inform the respective GD1 200' or GD2 350' player what game to play and the amount won at the end of the game. Corresponding elements of the GD1 200' and the GD2 350' to the EVM 200 and the EVM 350 as well as corresponding elements of the EST 202' to the ticket 202 and the EST 352' to the ticket 352 are denoted with primes.

Both the GD1 200' and the GD2 350' are preferably of the type as described above and include battery power and feature Liquid Crystal Display (LCD) screens (matrix screen for GD1 200'), push-to-play button(s), microprocessor containing game software, and batteries. Additionally, a multi-pin connector interfaces the ESTs 202' and 352' with the GD1 200' and GD2 350' units respectively. Preferably all of the GD1s 200' and GD2s 350' will be identical and do not have to be individually tracked throughout a manufacturing or warehousing process.

Also as described above, each of these embodiments of the ESTs 202' and 352' contains a pair of scratch spots, 550' and 552' on EST 202' and 554' and 556' on EST 352'. Scratching the Activation Key 550' or 554' causes the GD1 200' or the GD2 350' player to start the game. The second scratch spot 552' or 556' reveals the prize level of the EST that can be used for comparison to and confirmation with the displayed results at the end of the game. In the preferred embodiment, if an EST 202' or 352' having the first spot 550' or 554' previously scratched is inserted into either the GD1 200' or GD2 350', the final point total or some other indication that the EST 202' or 352' has been previously played or scratched is indicated on the LCD 280' or 362' and the game is not played.

As indicated above, the ESTs 202' and 350' can be used to essentially program the GD1 200' and GD2 350" units by setting a series of circuits to on/off conditions that are detected through a direct current connection. However, since the prize value of the game is determined by printed circuitry in the ESTs 202' and 350', it is considered desirable to take security precautions with the tickets 200' and 350' to prevent the picking out of winning tickets by measuring continuity of the prize bits. One security precaution would be to package each EST in an individual foil (i.e., conductive) pouch. However, individual pouching can be expensive and cumbersome.

The preferred security methodology entails printing parallel layers of conductive ink that effectively short all of the prize bits together through a single scratch-off spot connection on the EST 202' or 352'. This same scratch-off spot can also used by the GD1 and GD2 players 200' or 350' to ensure that an EST has not been previously played. For example, upon detecting an EST 202' or 352', the GD1 200' or GD2 350' can first verify that all Prize Level Bits and the Parity bit are set high (i.e., logic "1") and a bit associated with the EST's Activation Key 550' or 554' bit is also a "1" as described below in connection with FIG. 28. In other words, selected portions of the circuits printed on the ESTs 202' and 352' are shorted together prior to play.

Figure 28A:
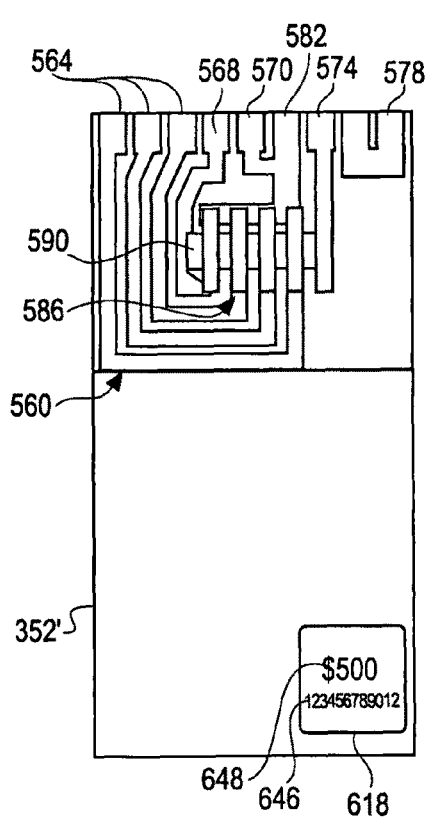
FIG. 28A and FIG. 28B are schematic diagrams of circuits printed on the substrate of the electronic scratch tickets of FIGS. 27 and 26 respectively.
Figure 28B:
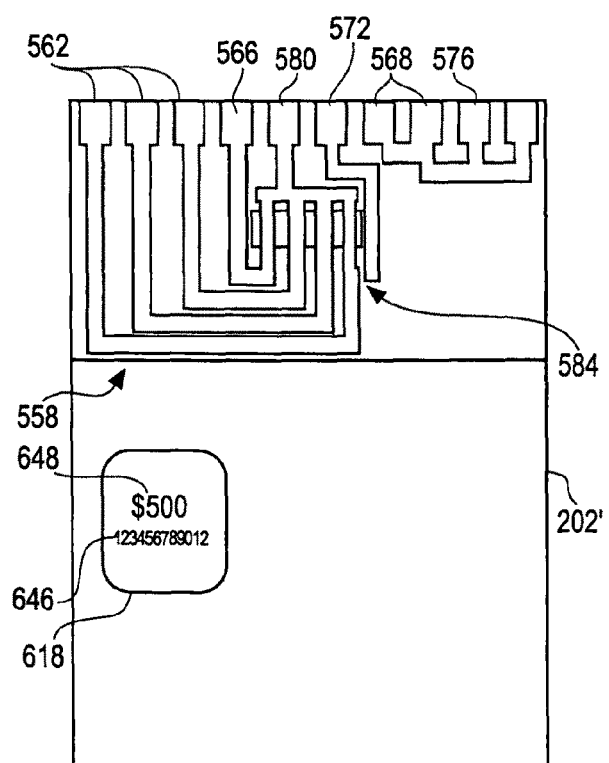

FIGS. 28A-B and 29A-B illustrate this approach in more detail. In the embodiment shown in FIG. 28A-B, each EST 202' and 350' respectively is printed in conductive ink with a Lower Conductive Circuit (LCC) 558 and 560 that includes: a set of prize level bit circuits 562 and 564; a parity bit circuit 566 and 568; one or more game ID bits circuits 568 and 570; an activation key bit circuit 572 and 574; a power circuit 576 and 578; and a common circuit 580 and 582. As shown in FIGS. 28A-B, a printed Upper Shorting Circuit (USC), indicated at 584 and 586 electrically connects the prize level bit circuits 562 and 552; the parity bit circuit 566 and 568 to effectively short these elements together. A release coat 588 and 590 depicted in FIGS. 29A-B is printed between the USC 584 and 586 and the LCC 558 and 560 and beneath the activation scratch-off keys 550' and 554'. The release coat 590 and 588 is oriented such that, in the embodiment shown in FIGS. 28A-B and 29A-B, the USC 584 and 586 connecting the Prize Level Bits $2^0$ through $2^2$ 564 and 562, and the Parity bit 566 and 568 is eliminated when the EST's Activation Key 550' or 554' is scratched off. As a result scratching off the Activation Key 550' or 554' will permit electrical continuity only to be maintained through the LCC 558 and 560.

As described with respect to FIG. 30, selective physical cuts in the prize level bit circuits 562 along with the parity circuits 566 illustrated here at a point 592 in the $2^2$ Prize Level bit at a point 594 in the $2^1$ bit on the EST 202', serve to establish the prize value of the ESTs 202' and 352' respectively. Also, it should be noted that in this embodiment the variable portions of the LCC 560 are oriented such that the traces are directly below the USC 584 and 586. This arrangement is designed to prevent a potential cheater from attempting to disable the shorting circuitry by making surgical cuts, that is, if an USC link is cut then the LCC will also be likely to be cut.

With reference to FIGS. 31A-B, it is possible that a small enough area of the activation key 550' or 554' could be scratched that would open the Activation Key sense circuit 572 or 574 without disconnecting the Prize Level Bits 562 or 564 or the associated Parity bit 566 or 568. In this event, the GD1 or GD2, 200' or 350', might not function correctly, that is for example, detect a parity error or paying out the wrong prize value. To protect against this potential situation, a third Scratch Detection conductive ink layer 600 and 596 can be printed above the LCCs 558 and 560 respectively as shown in FIG. 31 and the USC (shorting) circuitry. To enhance this function, the Scratch Detection conductive ink layer 600 and 596 is desirably electrically insulated from the other two conductive layers except for the V+/GND circuits 580 and 582 and Activation Key 572 and 574.

As shown in FIG. 31, a portion of the Scratch Detection conductive ink layer 600 and 602 is preferably positioned directly above the release coat 588 and 590 and the USC 588 and 586. With this arrangement, the center conductive Scratch Detection 600 and 602 rectangle would have to be completely scratched off before the Activation Key circuitry 572 or 574 would sense latex removal, otherwise there could be a path for current to flow from or to V+/GND circuits 576-582 to the Activation Key contact point. Since the Scratch Detection conductive ink layer 600 and 602 overlaps the USC conductive ink layer 584 and 586, a player will generally have to sever all the USC conductors 584 and 586 to eliminate the Scratch Detection rectangle 600 and 602. Preferably the Scratch Detection rectangle 600 and 602 is a large area comprising few conductive squares, thus a relatively high resistance conductive ink (i.e., carbon based) can be used for the conductive rectangle. Generally, higher resistance carbon based inks have lower cost than metal or synthetic conductor based inks while at the same time adding opacity to the security area 600 and 602 of the ESTs. This added opacity can help prevent cuts such as 592 and 594 from being picked out by such techniques as candling where a bright light is held up behind the EST 202' or 352' in an attempt to detect the cuts.

Referring to FIG. 32 and as previously discussed, the LCC Prize Level Bits 562 and 564 and the associated Parity bits 566 and 568 can be varied during a pressrun. In this embodiment an InfraRed (IR) laser is used to selectively cut the bit 562 and 564 and parity circuits 566 and 568 to make the LCC circuitry compatible with a prize value 648 and the barcode such as 310, 314 or 390 imaged on the ESTs 202' and 352'. As described below in more detail, a laser 682 can be focused on one spot of the web with the web motion providing a one-dimensional path or laser cut line 604. The laser 682 can then be timed to fire to vaporize the appropriate LCC Prize Level Bits 562 and 564 and associated Parity traces 566 and 568 in order to in effect program the ESTs 202' and 350' with the desired prized value.

Figure 33:
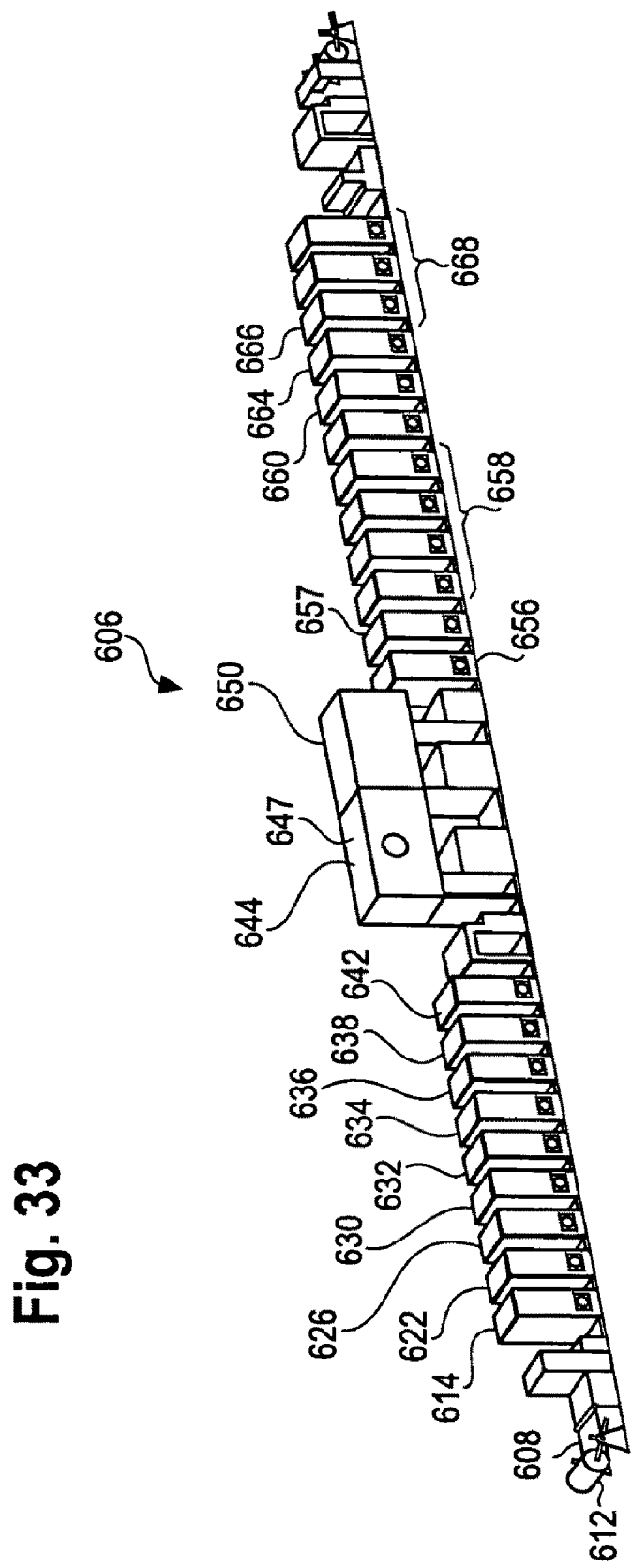
FIG. 33 is a block diagram of a first printing apparatus for printing the electronic scratch tickets of FIGS. 26 and 27.

FIG. 33 depicts a first embodiment of a multistage printing press arrangement 606 for printing ESTs of the types describe herein such as 202' and 352'. In connection therewith the preferred layers of ink and the respective alignments useful in creating secure ESTs are described below. The following describes an example of a method for printing ESTs such as 202' and 352' utilizing InfraRed (IR) lasers to achieve the desired conductive variability. This method begins with feeding a web 608 that preferably forms a paper or non-conductive foil substrate 610 for the ESTs 202' and 352' and which is fed from a supply roll 612 attached to one end of the press 606. FIGS. 34-46 then provide Illustrations of one or both the EST 202' and the EST 352' ticket structures and are discussed in connection with the description of the press arrangement 606 show in FIG. 33. In some cases elements of the ticket are shown as rotated ninety degrees counter clockwise on the web 608.

Figure 34A:
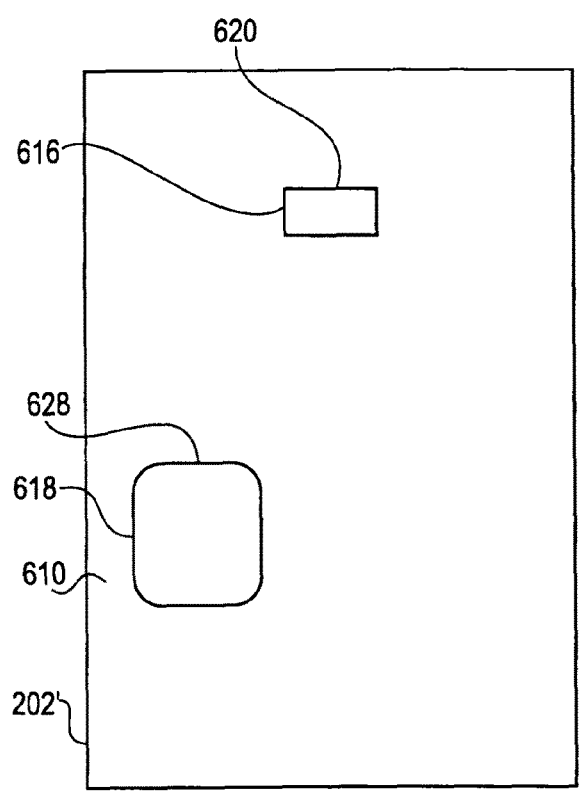
FIG. 34A and FIG. 34B are plan views of a lower blocking black printed on the substrate of the electronic scratch tickets of FIGS. 26 and 27 respectively.
Figure 34B:
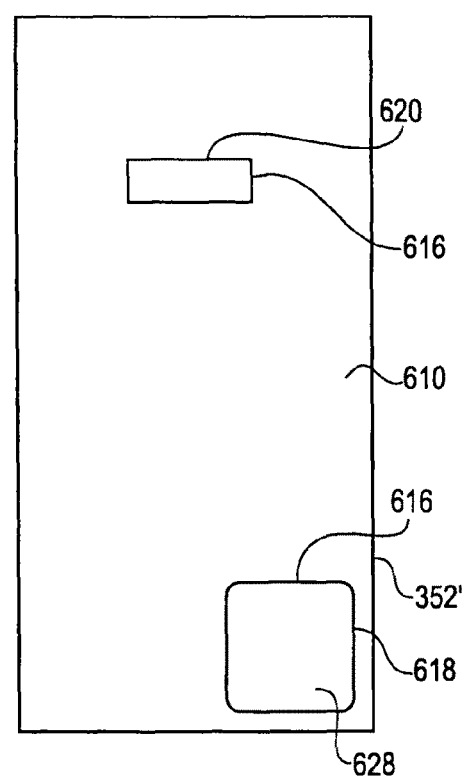

With reference to FIGS. 34A-B, the first coating in this embodiment to be applied to the substrate 610 by a first print station 614 is a layer of non-conductive Lower Blocking Black ink (LBB) 616. The LBB ink film 616 can also be used to print press registration markings as well as provide opacity security for scratch-off areas. As depicted in FIGS. 35A-B, the LBB ink film 616 is applied below both a prize scratch-off area 618 as well as an Activation Key scratch-off area 620. However, in some cases where it is elected not to image a three boxed digit number 622 under the Activation Key scratch-off area 620, see FIG. 38, then the LBB 616 would generally only be applied under the prize area 618 unless it was desired to use it for additional purposes such as for laser cut candling security. Preferably, the LBB 616 is printed as a non-conductive ink film, having a sheet resistivity greater than ten million ohms per square, that is, >10 MΩ/□.

Figure 35:
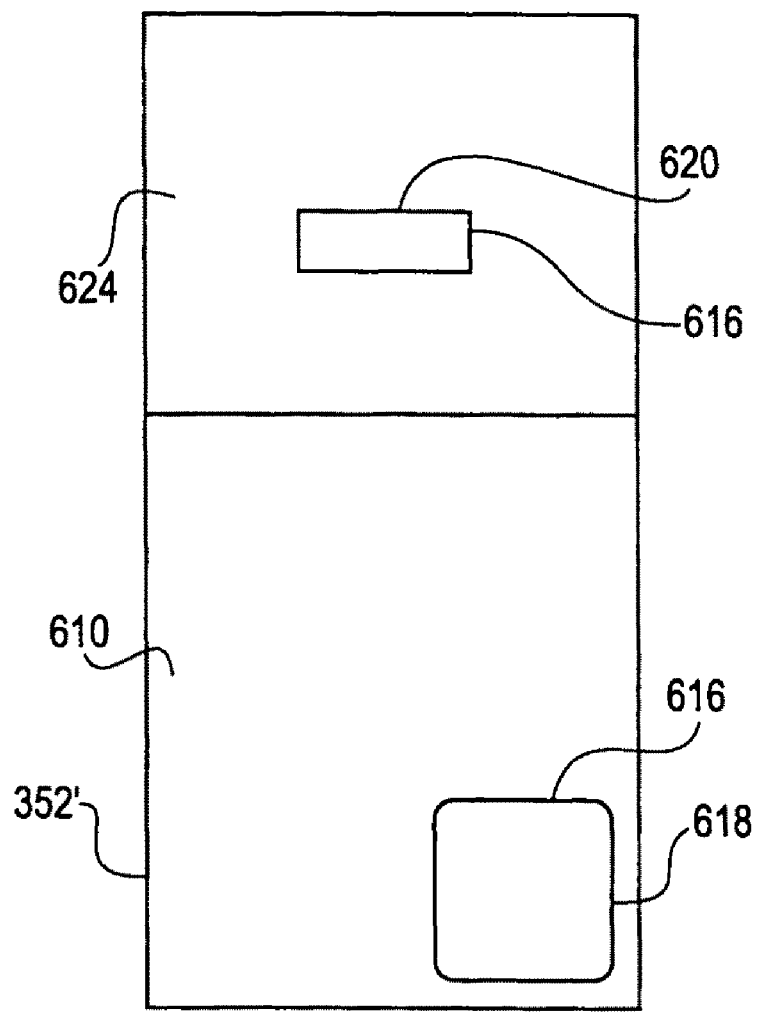
FIG. 35 is plan view of a seal coat and a process black printed on the substrate of the electronic scratch ticket of FIG. 27.
Figure 38:
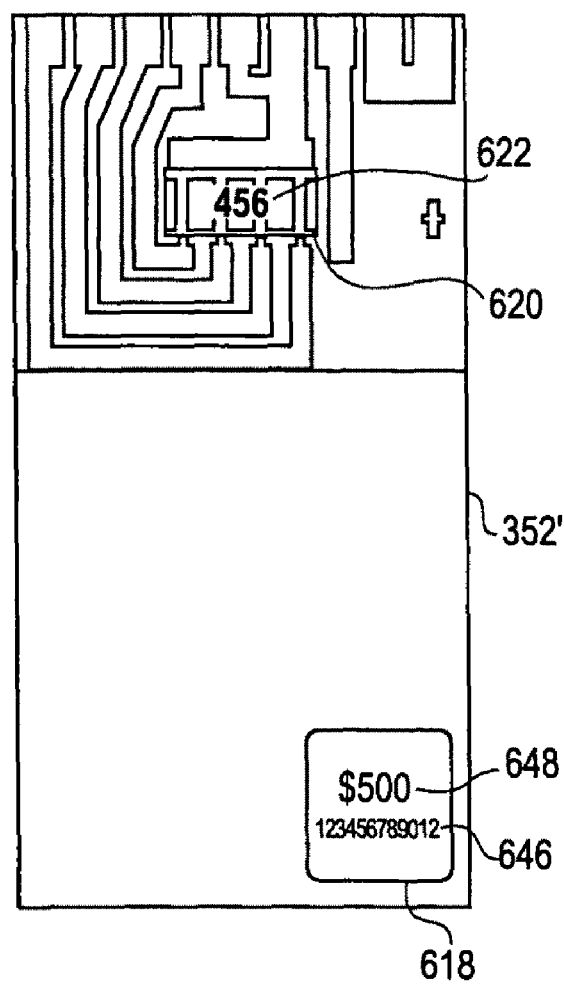
FIG. 38 is a schematic diagram of the lower conductive circuits and a set of variable human readable data printed on the substrate of the electronic scratch tickets of FIG. 27.

FIG. 35 depicts the next coating to be applied by a second print station 622 to the EST 352' in this embodiment. Here a seal coat 624 is applied to the substrate 610 to provide both a reflective base to help prevent the IR lasers, described below, from cutting through the paper substrate 610 as well as provide a barrier to prevent the conductive ink in the LCC 558 and 560 from being absorbed in the paper substrate 610. The seal coat 624 is preferably a water-based ink with a pH range of between 8.6 to 9.

Again, with reference to FIG. 33 a third print station 626 can be used to apply a process color black 628, shown in FIGS. 34A-B. Generally, the display/process black (K) 628 is for decorative purposes and can vary from game-to-game and is not a part of the EST circuitry. Preferably, the display/process black (K) 628 is a non-conductive ink film having a sheet resistivity greater than ten million ohms per square, >10 MΩ/□.

FIG. 36 indicates that a fourth print station 630 can be used to print the lower conductive circuits LCC 558 and 560. A number of conductive inks can be used for this purpose but the preferred ink contains nano sized silver particles. A suitable ink having such particles can be obtained from PChem Associates, Inc., Suite D, 3599 Marshall Lane, Bensalem, Pa. 19020. In this embodiment, the silver nano ink film functions as the principle electrical conductor on the ESTs 202' and 352'. The ink sheet resistivity for the silver nano ink film is preferably at most 500Ω/□, and more preferably have ink sheet resitivities of <10 Ω/□.

Again with reference to FIG. 33, a set of three print stations 632-636 can be used for display printing on the ESTs 202' and 352'. In this embodiment the print stations apply the three CMY process colors. As with the display black (K), these process colors are generally for decorative purposes and can vary from game-to-game and in this embodiment do not form a part of the EST circuitry. Also, the inks preferably are non-conductive ink films, where each color exhibits a sheet resistivity greater than ten million ohms per square, >10 MΩ/□ and thus can be used as insulators in various other configurations of ESTs.

FIGS. 37A-B illustrate the results of an eighth print station 638. Here printing a standard primer/white mask 640 can be used to provide a primer base for an ink jet dye as well as a higher contrast background. As shown in the example of FIG. 37, the primary mask 640 is applied over the prize scratch-off area 618, the Activation Key scratch-off area 620 as well as a portion of the circuitry tracks 558 and 560. It should be noted, that in addition to its normal functionality as a primer and mask the ink film 640 can also function as a partial insulator to help electrically isolate the LCC printed traces 558 and 560 from the Upper Shorting Circuitry (USC) layer as described below. To enable the primer/white mask ink film 640 to functions as an insulator, it is desirable that it have a high resistance and preferably a sheet resistivity greater than ten million ohms per square, >10 MΩ/□.

Figure 3:
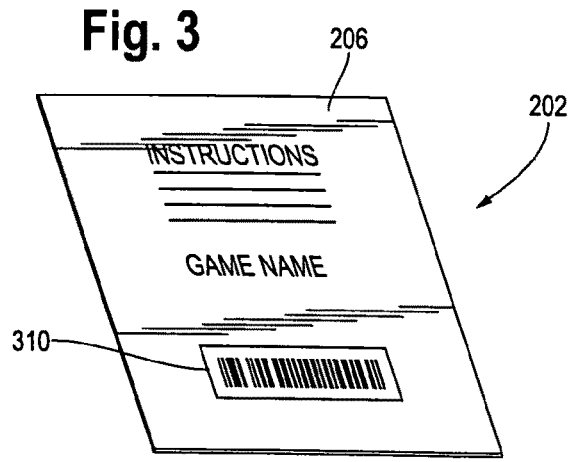
FIG. 3 is a back plan view of the lottery ticket of FIG. 2.

Returning to FIG. 33 a ninth print station 642 can be used to print the back of the ticket with various form of general information that is constant for every ticket in a game such as the instructions as to how to play the game shown on the back 206 of the ticket 202 in FIG. 3.

FIG. 33 also illustrates in block form apparatus for imparting variable data on the ESTs 202' and 352'. A block 644 represents a tenth print station that includes an ink jet imager assembly of the type that is typically used in the manufacture of scratch off lottery tickets. In the preferred embodiment, the ink jet imager 644 can be used to image directly over the standard primer/white mask layer 640 ticket specific data. For example, manual validation data, such as the number shown at 646, and the prize value of the EST, such as a prize value of $500 shown at 648 in FIG. 38, can be imaged in the prize box area 618. Also, the set of three security digits 622 can be imaged in the Activation Key area 620.

In addition, the imager assembly 644 can include a separate back imager, indicated generally at 647, that can be utilized to print a validation barcode such as the bar code 310 or 390 on the back of the tickets 202' or 352' The front imager 644 can also be used to print ticket specific data such as the value 648 on the front of the ESTs 202' and 352'. Finally, the ink jet imager 644 can be used to print timing marks 674-680 that control the firing of the IR laser 682 as described below.

As described in more detail below, the printing arrangement 606 of FIG. 33 can include in an eleventh print station, an IR laser assembly indicated at 650. One object of the laser assembly 650 is to selectively physical cut printed circuits such as the prize level bit circuits 562 and 564 along with the parity circuits 566 and 568 in order to establish the prize value of the ESTs 202' and 352' respectively.

Figure 39:
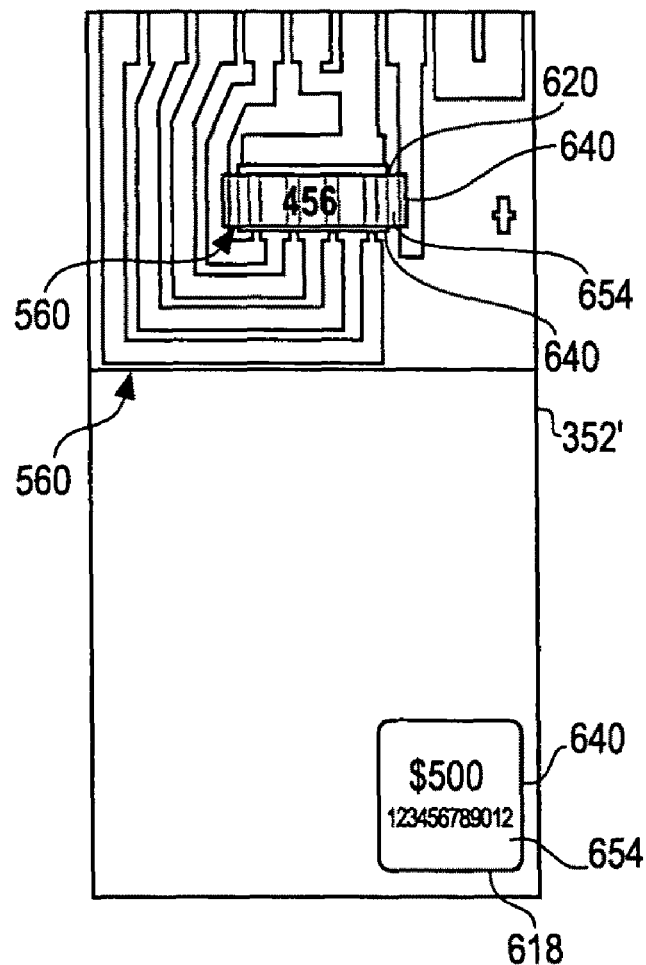
FIG. 39 is a schematic diagrams of the lower conductive circuits and a release coat printed on the substrate of the electronic scratch tickets of FIG. 27.

FIG. 39 indicates in this embodiment that at a twelfth print station 652 the next ink film to be applied is a standard release coat indicated by 654 on the EST 202'. Here, the release coat 654 is applied as an overprint to both the prize box 618 and Activation Key 620 areas. Preferably, as with the primer/mask 640, the release ink film 654 can also function as an insulator to help electrically isolate the LCC printed traces 560 from the USC ink layer 586.

Figure 40:
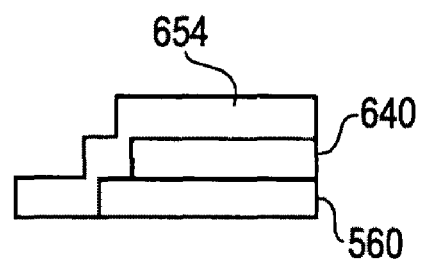
FIG. 40 is a sectioned side view of the release coat and the white mask printed on the substrate of the electronic scratch ticket of FIG. 27.

FIG. 40 illustrates the preferred method where the release coat 654 is applied over a larger area than the white mask/ primer 640. Generally it is preferred that such a stepped structure for the size and shapes of the various security layers be used.

Figure 41A:
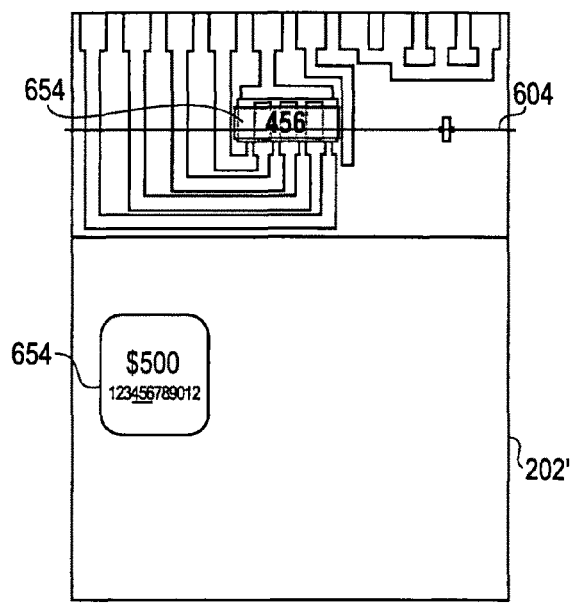
FIG. 41A and FIG. 41B are schematic diagrams of the lower conductive circuits and the release coat covering a laser cut line printed on the substrate of the electronic scratch tickets of FIGS. 26 and 27 respectively.
Figure 41B:
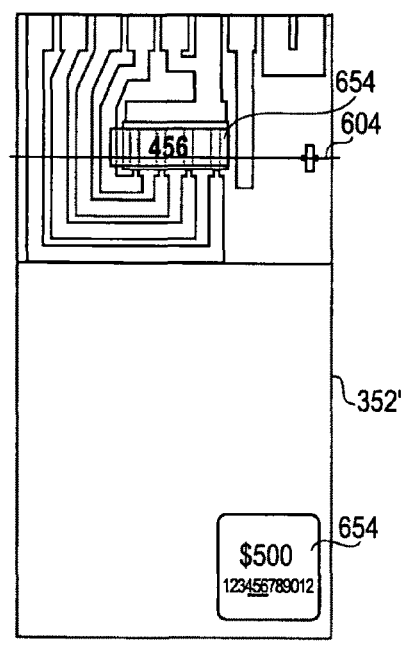

FIG. 41 illustrates that in certain cases it can be desirable to place the release coat ink film 654 such that the laser cut line 604 will also be covered by the release coat.

FIGS. 42A-B illustrate the next step in the process where a thirteenth print station 657 prints the USC 584 and 586 layer on top of the release coat 654, the white mask 640, and the LCC 558 and 560. As previously described, one purpose of the USC 584 and 560 in this embodiment is to short all of the prize value bits and parity bit together on unscratched tickets. In this case, once the EST 202' or 352' is scratched, the USC ink film 584 and 586 printed on top of the release coat 654 will be removed and conductivity from power source 578 or 580 will be maintained by the LCC 558 or 560. As with the LCC 558 and 560, the USC 584 and 586 in this first embodiment is preferably composed of a highly conductive ink such as the silver nano ink exhibiting a sheet resistivity of typically less than <10Ω/□. In this embodiment, the preparation and printing specifications for the USC 584 and 586 are similar to the LCC 558 and 560.

Figure 43:
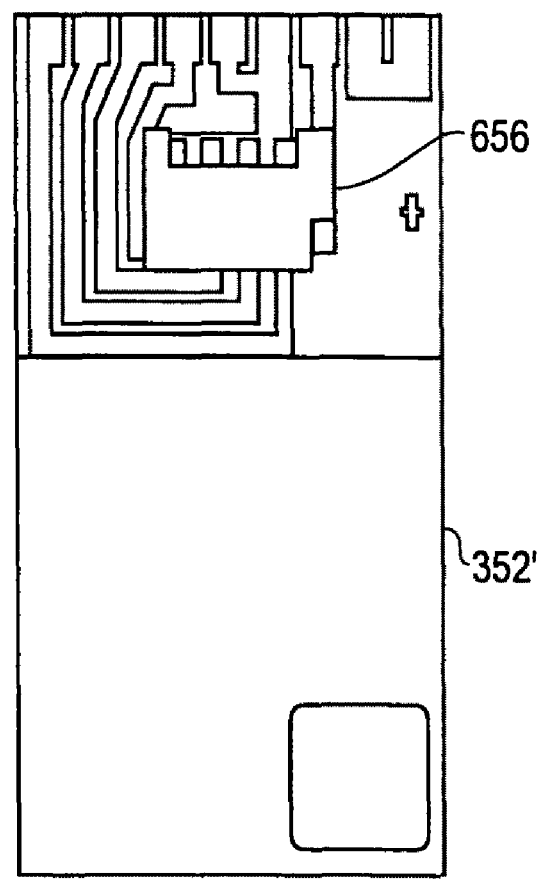
FIG. 43 is a schematic diagram of conductive circuits and a set of insulating layers printed on the substrate of the electronic scratch tickets of FIG. 27.

FIG. 43 depicts a set of four insulating layers indicated at 656 that in this embodiment can be applied by a group of print stations, indicated generally at 658 in FIG. 33, to electrically isolate the USC 584 and 586 from the Scratch Detection layer 600 or 602 as described below. Preferably a water-based insulator is used in this application 656. Also, it is preferred that the four layers of insulator 656 are gradually stepped. In addition, and as shown in FIG. 43 the insulator layers 656 are preferably arranged in an irregular pattern. It is also, preferred that the pH range for the insulator ink 656 be between: 8.6 to 9.2.

As shown in FIGS. 44A-B, next layer, the conductive Scratch Detection ink film 600 and 602, is applied by a print station 660. Here, the Scratch Detection layer 600 and 602 is preferably applied as an optical opacity overprint to both the prize box 618 and the Activation Key 620 areas. However, the conductivity of the Scratch Detection ink film 600 and 602 can also provides a sense signal to the GD1 player 200' and the GD2 player to 350' indicate whether the scratch-off Activation Key area 620 has been totally removed. Due to the small number of squares (□) employed in the Scratch Detection layer 600 and 602 in this example (i.e., large shape) the ink sheet resistivity of the Scratch Detection ink film is preferably on the order of $\leq$2,000Ω/□. It is also desirable in this particular embodiment that the Scratch Detection layer 600 and 602 make direct contact with the LCC circuitry 558 and 560 at the V+/GND common horizontal bar 576 and 578 as well as the track to the Activation Key area 620.

Figure 45:
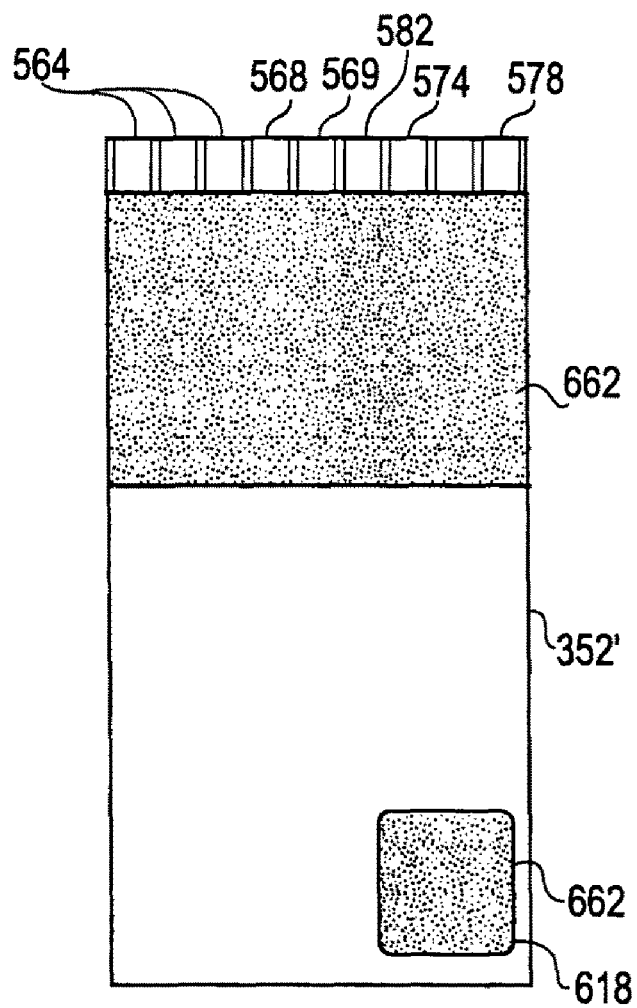
FIG. 45 is plan view of a scratch off coating printed on the substrate of the electronic scratch ticket of FIG. 27.

FIG. 45 indicates that an industry standard white Scratch Off Coating (SOC) 662 can preferably be applied by another print station 664 over substantially all of circuitry in the ESTs 202' and 352' except for the outer contacts of circuits 564, 568 569, 582, 574 and 578 as shown in FIG. 45. Also the SOC 662 can be used to cover the prize box area 618. In addition, the SOC 662 can provide the base covering for overprints. If desired, a second SOC overprint can be added by another print station 666, shown in FIG. 33 to provide better coverage. Then, as is typical with lottery tickets, a color overprint can be applied over the SOC 662 by another set of print stations indicated at 668. Preferably, the overprint inks printed by the stations 668 should have sheet resistivity greater than ten million ohms per square—i.e., >10 MΩ/□.

Figure 46:
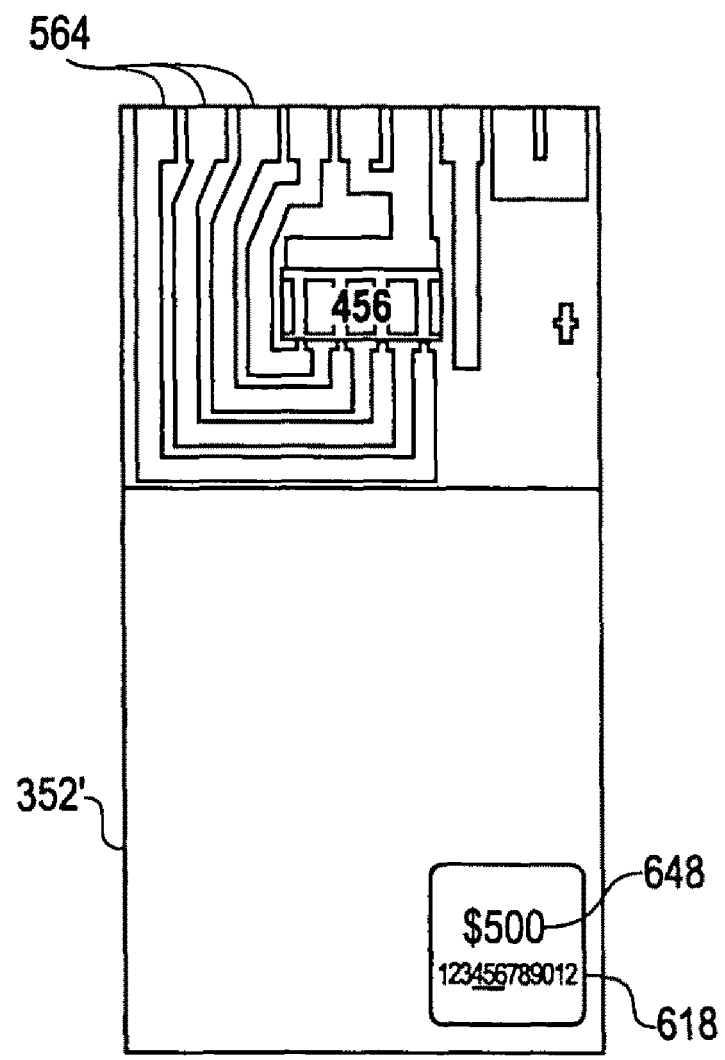
FIG. 46 is a schematic diagram of conductive circuits and a set of human readable indicia printed on the substrate of the electronic scratch tickets of FIG. 27.

FIG. 46 illustrates with the example of the EST 352' how the ESTs 202' and 352' can communicate a prize value programmed into ESTs 202' and 352' to the GD1 player 200' and the GD2 350' player respectively. Specifically, the prize value of the EST 202' or 352' is defined by the continuity of the three prize conductive links 564 printed on the EST 352'. As described above, the continuity of the links 564 can serve as bits. Prior to the player scratching-off the Activation Key scratch off area 620, which of these prize bits are present will, in effect, be unknown to the player and the GD2 350' because USC 586 provides a parallel electrical path. However, once the Activation Key scratch-off area 620 is scratched off by a player, the USC 586 is removed and the continuity of the prize determining conductive links 564 themselves can be used to determine the prize value of the EST 352' as shown in FIG. 46. At this point the GD2 350' will read the Prize Level Bits $2^0$ through $2^2$ as described above to determine the final outcome of the game to be played.

Also in this embodiment, it is desirable that the prize value of the game to be played agree with both the prize value 648 shown as printed as for example $500 in the prize box 618 in FIG. 46 and the prize value that can be encrypted in the EST's barcode 390. As a result, the preferred procedure is to have the value of the prize level bits $2^0$ through $2^2$ engraved in the conductive links 564 and the parity bit 568 be synchronized with the imager data that is used by the imager 644 to print the human readable indicia 648 printed on in the prize box 618.

Figure 47:
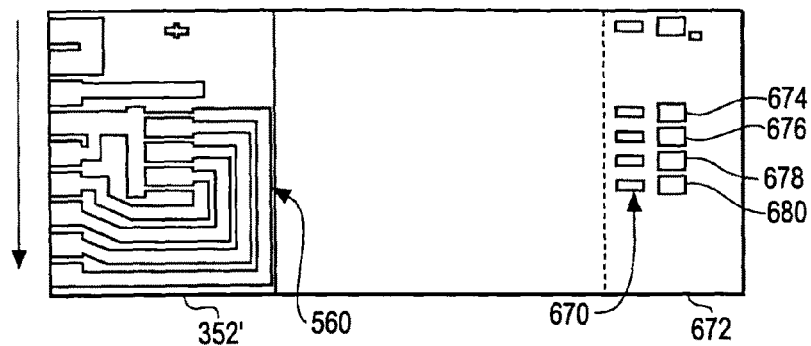
FIG. 47 is a schematic diagram of conductive circuits and a set of laser synchronizing marks and laser trigger marks printed on the substrate of the electronic scratch tickets of FIG. 27.
Figure 48:
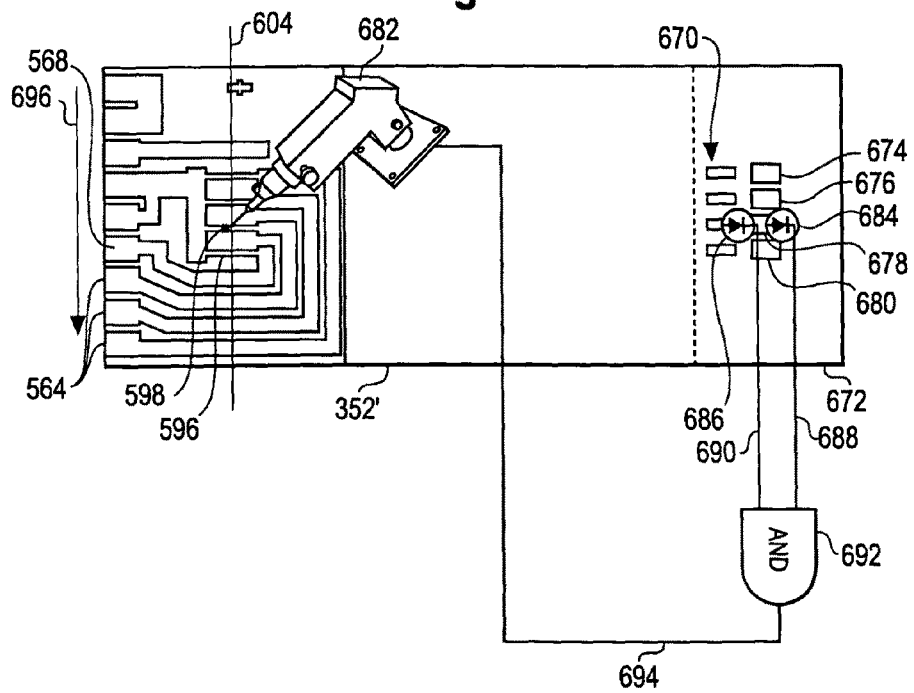
FIG. 48 is a schematic diagram illustrating a laser cutting of conductive circuits printed on the substrate of the electronic scratch tickets of FIG. 27.

FIGS. 47 and 48 illustrate, with the EST 352' as an example, the preferred method in this embodiment for synchronizing the prize level bits $2^0$ through $2^2$ with the data from the imager 644. Preferably, a multistage flexographic print apparatus of the type 606 shown in FIG. 33 is used to print all the prize level bits in tack in conjunction with printing the LCC 558 and 560 on the ESTs 202' and 352' respectively. In this case, the imager data such as the prize value 648 and the bar code 390 is printed by the imager 644 on both sides of the EST 202' or 352' in a manner similar to printing variable data on a standard scratch-off lottery ticket. A set of printed Laser Synchronization Marks (LSM), indicated by 670 are printed on a gutter portion 672 of the EST 352' at the same time the LCC 560 is printed by the print station 630 shown in FIG. 33. In the described method, the "gutter" portion 672 of the EST 352' is removed at the end of the manufacturing process and before the ESTs 352' are packaged and distributed to customers. The LSM marks 670 are preferably directly centered or aligned with the portion of the LCC 564 that represents the prize level bits $2^0$ through $2^2$ and the parity bit 568.

Also, imaged by the imager 644 on the gutter portion 672 of the EST 352' are a set of four Laser Trigger Marks (LTM) 674-680. In this example, whether or not a specific LTM 674-680 is imaged on the EST 352' will depend upon the prize value of the EST 352'. In effect the LTMs 674-680 define which of the prize level bits $2^0$ through $2^2$ in the LCC should be cut to give the EST 352' the desired prize value. Since it is desirable in this embodiment that the prize value of the EST 352' as defined by the LTMs 674-680 correspond to both the prize value 648 imaged in the prize box 618 in FIG. 46 and encrypted in the ticket's barcode 390, selection of which of the LTMs 674-680 to be imaged will be controlled by the imager data that is used by the imager 644 to print the human readable indicia 648 and the barcode 390. And, preferably, they are all imaged at the same step of the process.

FIG. 48 depicts in schematic form a laser 682, mounted in the IR laser assembly 650 shown in FIG. 33, to cut gaps, such as the gaps 596 and 598 in the prize level bits $2^0$ through $2^2$ in the portion 564 of the LCC 560 along with a gap in the parity bit 568. Preferably an IR, $CO_2$, air-cooled laser with an 80 W maximum output power using a 220 VAC primary power supply is used for the laser 682. This type of laser can be obtained from Synrad, Inc., 4600 Campus Place, Mukilteo, Wash. 98257. In this embodiment, a pair of photoelectric sensors 684 and 686, also contained in the IR laser assembly 650, are connected, as represented by a pair of lines 688 and 690 to an AND gate 692 that in turn is connected via a line 694 to the laser 682. As the web 608 containing the ESTs 352' moves through the IR laser assembly 650 in the direction indicated by an arrow 696, the photoelectric sensors 684 and 686 will detect the LSMs 670 along with which of the LTMs 674, 676, 678, or 680 are imaged on the EST 352' in order to activate the laser 682 to cut the desired gaps in the LCC 560. In this manner the EST 352' can be programmed with the desired prize value. Preferably, the LSMs 670 are printed as marks that overlap all of the conductive elements in the LCC 560 which might be cut by the IR laser 682. Also, as shown in FIG. 48, the LSMs 670 are logically 'AND'ed, as represented by the AND gate 692, with the LTMs 674-680 to help ensure, in this example, that only when the press 606 is in proper register will the laser 682 have the potential to fire. In this embodiment, the LSMs 670 are printed on the gutter portion 672 of every EST 352' and thus the ink jet imaged LTMs 674-680 provide synchronization with the EST's imaged prize values since, here, the LTMs 674-680 were ink jet imaged at the same time as the human readable data 648 and the barcode 390.

Figure 49:
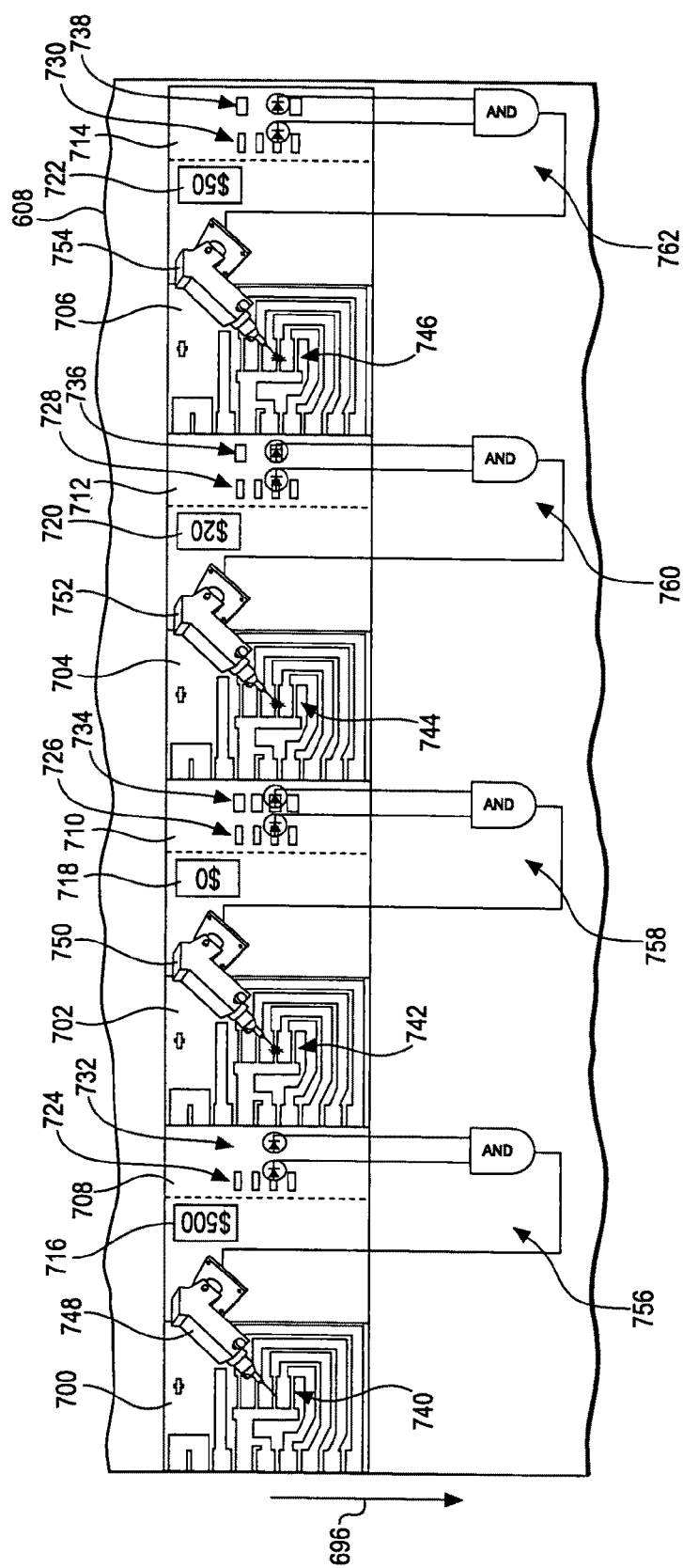
FIG. 49 is a schematic diagram illustrating a laser cutting of conductive circuits printed on a the substrate of a set the electronic scratch tickets of FIG. 27.

FIG. 49 illustrates the preferred laser cutting methods and in particular to a technique for the parallel printing of at least four programmable EST tickets of the type 352' described above. Here, a set of four EST tickets 700-706, each having an associated gutter portion 708-714, is shown in simplified form, spaced across the web 608. As with the EST 352' described above, each of the ESTs 700-706 has an imaged prize value, indicated at 716-722 respectively. In addition, each of the ESTs 700-706 includes a set of imaged LSMs indicated at 724-730 along with a corresponding set of imaged LTMs indicated at 732-738. The number and location of LTMs in each of the sets 732-738 corresponds to the prize value 716-722 imaged on the ESTs 700-706. For example, the EST 700 has a prize value of $500 imaged at 716 and the set 732 contains no LTMs aligned with the four LSMs in the set 724. Similarly, the EST 702 has a prize value of $0 imaged at 718 and the set 734 contains four LSMs; the EST 704 has a prize value of $20 imaged at 720 and the set 736 contains two LTMs aligned with the second and third LSMs in the set 728; and the EST 706 has a prize value of $50 imaged at 722 and the set 738 contains two LTMs aligned with the first and fourth LSMs in the set 730.

In FIG. 49, the web 608 is shown moving in the direction of the arrow 696 through the laser assembly 650. Positioned over the portions of a set of conductive links indicated by 740-746 that include the prize level bits $2^0$ through $2^2$ and the parity bit of the ESTs 700-706, that correspond to the conductive links 564 and the parity bit 568 of the EST 352', are a set of four lasers 748-754 respectively. As with the laser 682 described above, a pair of photoelectric sensors are logically ANDed together, generally indicated at 756-762, and are effective to fire the lasers 748-754 in response to the number and location of the LTMs 724-730 as the web 608 passes beneath the lasers 748-754. Thus, the lasers 748-754 serve to cut or sever selected conductive links 740-744 such that the ESTs 700-706 are programmed with the prize values 716-722 corresponding to the values imaged on the ESTs 700-706. Although not shown in FIG. 49, it is also preferable that the lasers 748-754 also cut through a primer/white mask layer of the type 640 depicted in FIG. 37.

Figure 50:
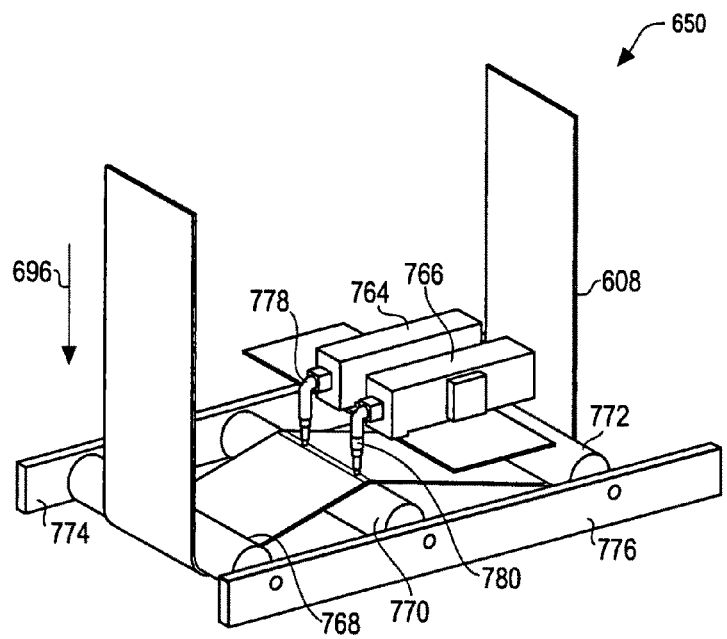
FIG. 50 is a side perspective view of a laser assembly for use with the printing apparatus of FIG. 33.
Figure 51:
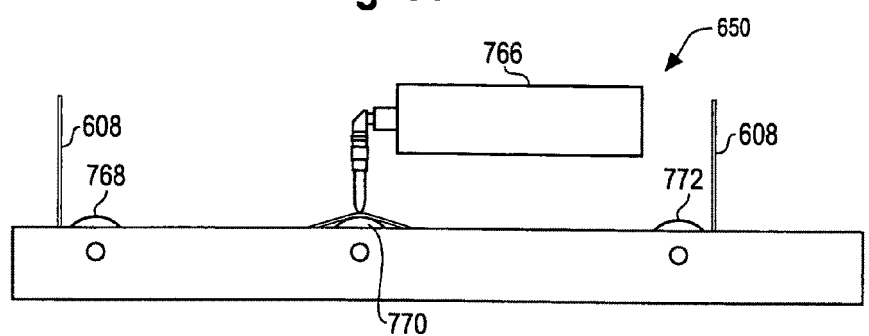
FIG. 51 is a side view of the laser assembly of FIG. 50.

FIGS. 50 and 51 show a simplified view of an arrangement of a pair of lasers 764 and 766 in the laser assembly 650. Here the web 608 moving in the direction 696 is lead by a set of rollers 768-772 supported by a pair of frame members 774 and 776 very close to a pair of firing nozzles 778 and 780 of the lasers 764 and 766 respectively.

Returning to FIG. 52, the process can terminate as is typical for the production of instant type lottery tickets with the web 803 traversing a perforator, die cutter and folder station 780 where the gutters 708-714 are removed from the ESTS 700-706.

Figure 52:
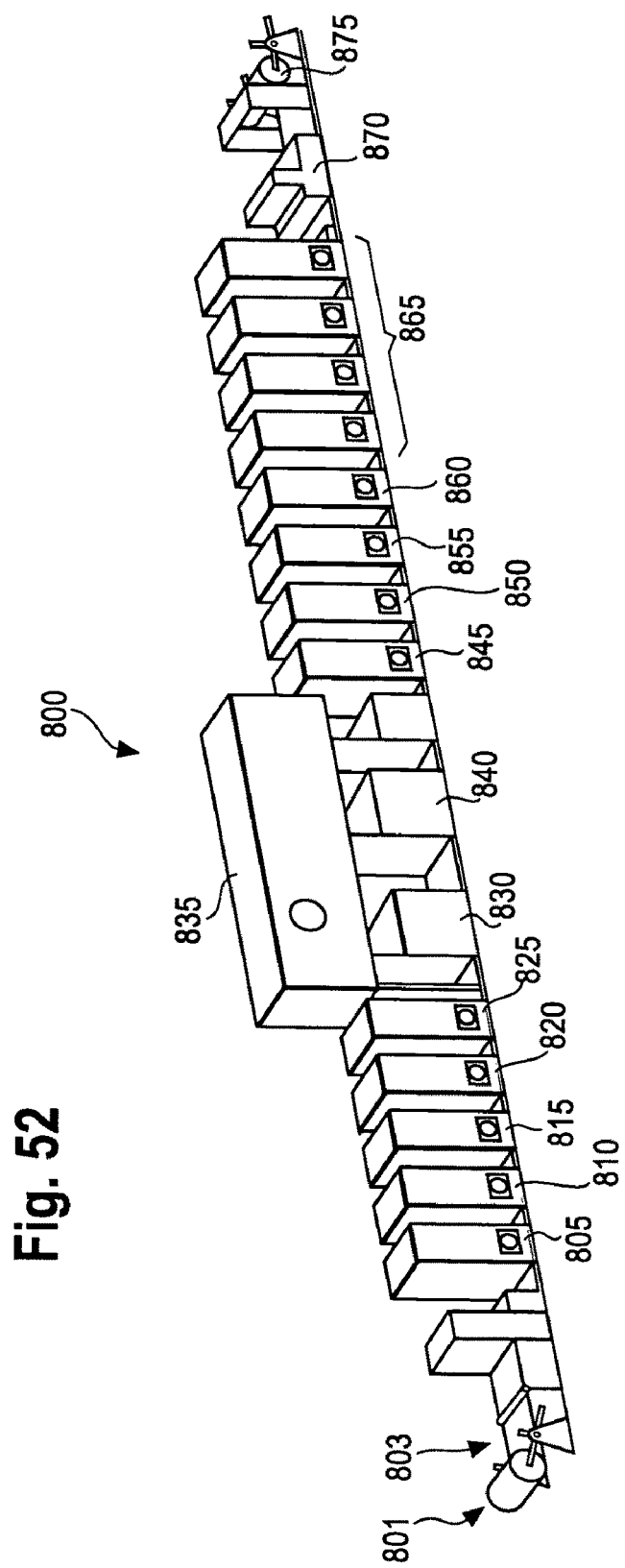
FIG. 52 is a block diagram of a second printing apparatus for printing the electronic scratch tickets.

While the above first embodiment described above discloses one implementation of EST construction and laser cutting, it requires a large printing press 606 as illustrated in FIG. 33 that might include up to twenty-one printing stations. A second or alternative embodiment, requiring fewer printing stations, is illustrated in FIG. 52. In this embodiment, only two conductive layers of ink are used to manufacture an EST. Moreover, the layout of the circuitry is modified to reduce or eliminate the need for insulating layers, further reducing complexity and costs. The significant differences between this embodiment and the first embodiment described above are highlighted below. For simplicity, only an EST compatible with the GD2 type player will be discussed, however it is understood that the same technique could be applied to printing an EST compatible with the GD1 player.

Figure 53:
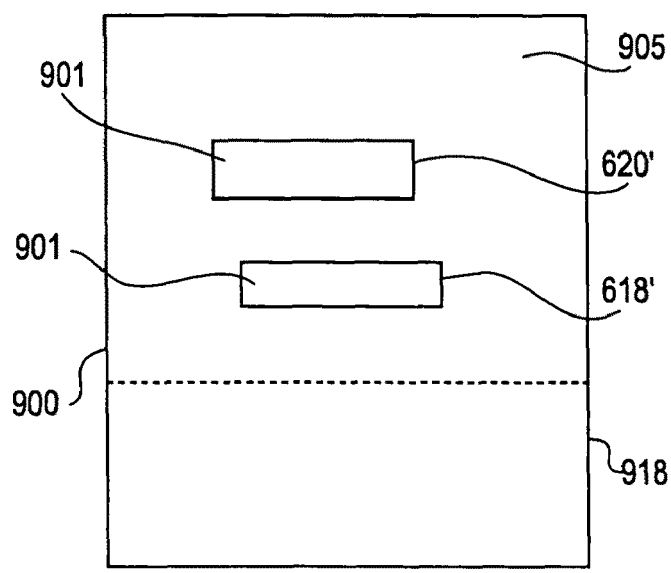
FIG. 53 is a plan view of an electronic scratch ticket including a lower blocking black layer and a seal coat layer that can be produced on the printing apparatus of FIG. 52.

Referring to FIG. 53, the following describes an example of a method using a press arrangement 800 for printing an EST 900 with IR lasers to achieve the desired conductive variability with a limited number of print stations. This method begins with feeding from a supply roll 801 a web 803 that forms a paper or non-conductive foil substrate for the EST 900.

As depicted in FIG. 53, and as with the first embodiment, a first layer of ink 901 to be applied by a print station 805 is a nonconductive Lower Blocking Black (LBB) that is used for opacity and printing of registration marks. FIG. 53 illustrates the LBB ink film 901 below both a prize scratch-off area 618' as well as an Activation Key scratch-off area 620' that generally correspond to the previously described EST production. The formulation and ink requirements for the LBB ink film 901 are preferably the same as the LBB 616. Referring back to FIG. 52, a second print station 810 prints a laser seal coat 905 over the ticket's surface 900 as shown in FIG. 53. As before the laser seal coat 905 can provide a barrier to the beam of a laser cutting through the paper as well as protection against any conductive inks being absorbed into the paper substrate 900. The formulation and requirements of the seal coat 905 are preferably the same as the previously described seal coat 624.

Figure 54:
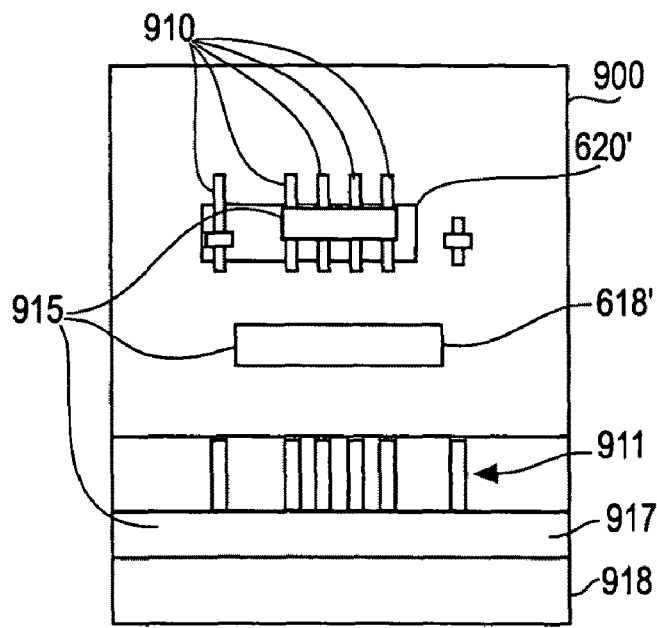
FIG. 54 is a plan view of the electronic scratch ticket of FIG. 53 including a lower conductive black and a white mask layer.

As shown in FIG. 54, a third print station 815 depicted in FIG. 52 prints a Lower Conductive Black (LCB) ink 910 that replaces the LCC layer in the first embodiment. As shown in FIG. 54, only the conductive lines in the LCB 910 that could be potentially cut by the IR laser as well as a set of associated LSMs 911 are printed in the LCB 910. Because the LCB conductive traces 910 are short and therefore have few squares, the resistivity of the LCB can be on the order of $\leq 5,000\Omega/\square$. There are four advantages to using the LCB 910 instead of a silver nano LCC layer of the type 558 and 560 at this stage. The first is that the LCB 910, being dark in color, is highly absorptive to IR light and consequently requires far less laser power to cut than a more reflective silver nano ink. Thus, lower powered and less expensive lasers can be employed in the production of the EST 900. A second reason for using LCB 910 is that the LCB 910 is substantially less expensive than the silver nano based LCC ink film 558 or 560. Thus, by reducing the use of a silver nano ink to one print station as discussed below, savings can be realized in ink consumption including set-up and priming pump consumption. A third advantage is that since the LCB 910 is dark in color it is easily detected by the photo cells of the type 686 that can be used to control the firing of an associated IR laser. Another advantage is that because the LCB 910 has a higher resistivity than the silver nano ink used in the USC discussed below, it makes it much more difficult for someone to pick out winning tickets using an ohm meter in situations where the USC's resistivity has been allowed to increase due to printing defects. Thus, this embodiment has the advantage of being more tolerant to printing defects while maintaining security. The LCB 910 having a higher tolerance for resistivity can be easily manufactured by anyone skilled in the art of ink chemistry.

Next, a print station 820 prints a white mask layer 915 over the Activation Key 620 and the Prize Box 618 areas as well as an imaging area 917 of a timing gutter 918 of the EST 900. As before, the white mask 915 facilitates human readable imagery by providing a higher contrast background. Additionally, the band of white mask 915 in the gutter 918 can increase the uniformity of a set of LTMs 921 to be printed by an imager. The preferred formulation of the white mask 915 is similar to the formulation of the previously described white mask 640.

Next, a print station 825 can be used to print human readable information on the back of the EST 900.

Figure 55:
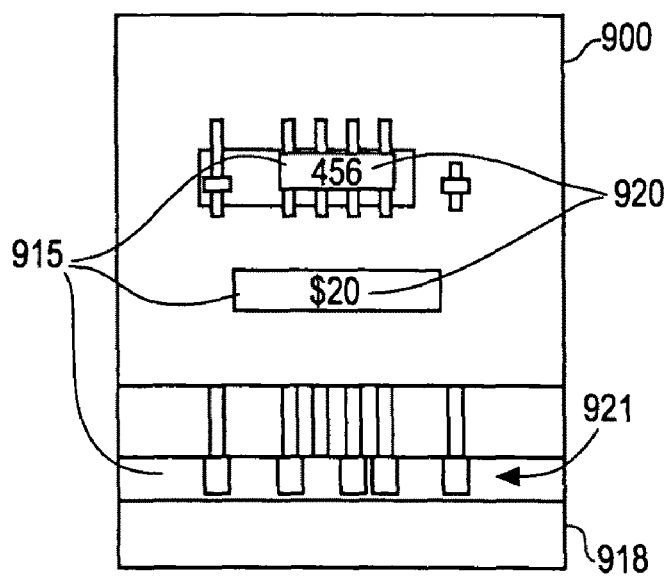
FIG. 55 is a plan view of the electronic scratch ticket of FIG. 53 including a lower conductive black, a white mask layer and imaged indicia.

FIG. 55 illustrates that a front ink jet imager 830 of the apparatus 800 can then be used to image a set of human readable indicia, indicated at 920, as well as imaging a set of associated LTMs 921 on the white mask 915.

Then an IR laser located at 835 in the apparatus 800 can be used to cut, in the manner of the first embodiment described above, the appropriate LCB traces 910 as defined by the LSMs 911 and LTMs 921. A back imager 840 then can be used to image a barcode and variable human readable information (not shown) on the back of the EST 900.

Figure 56:
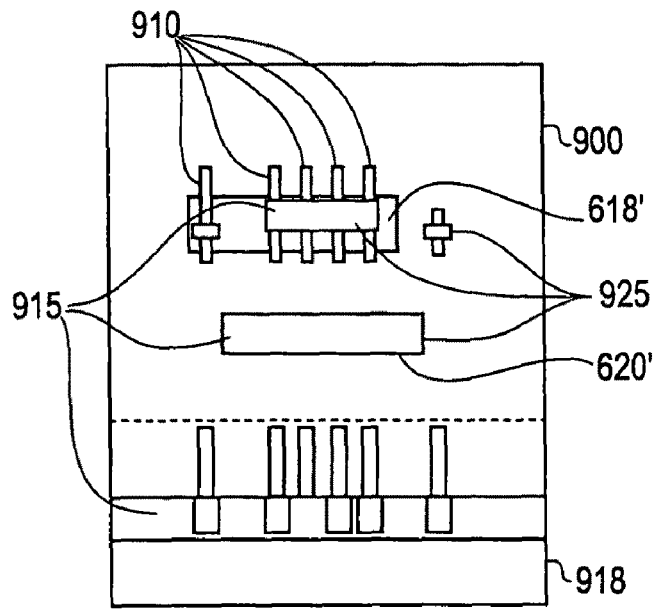
FIG. 56 is a plan view of the electronic scratch ticket of FIG. 53 including release coat layer.

As illustrated in FIG. 56 a print station 845 can be used to print a release coat 925 over the white mask 915 portion of the Activation Key 620' and the Prize Box 618' in a manner similar to the first embodiment. The formulation and requirements of the release coat 925 can be of the same type as the release coat 588 and 590.

Figure 57:
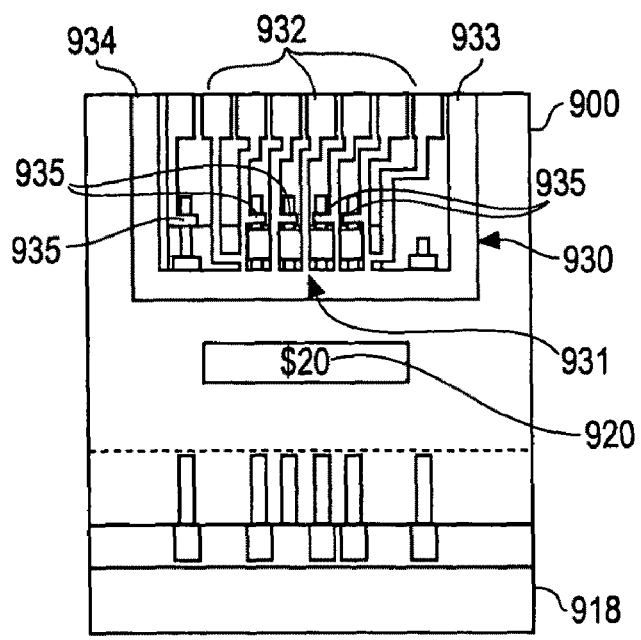
FIG. 57 is a plan view of the electronic scratch ticket of FIG. 53 including silver nano ink layer.

FIG. 57 depicts a layer of, preferably, silver nano ink, generally indicated at 930, that can be printed by a print station 850. In this embodiment of the EST 900 only a single layer of the silver nano ink, generally indicated by 930, is used. The same silver nano ink used in the first embodiment can also be used here. In this embodiment as represented by the EST 900, a portion of the silver nano ink layer 930 can provide an Upper Shorting Circuitry (USC), indicated by 931 and a set of shorting traces indicated by 932 as well as most of the other printed circuit traces in a single print station such as the print station 850. By printing the silver nano conductive traces 930 in one print station 850 the costs associated with preparing two print stations with silver nano ink can be reduced. Additionally, by laying out the silver nano USC 931 traces parallel to the LCB conductive traces 910, it is possible to eliminate the use of an insulator between the silver nano and the LCB 910. Here, the USC 910 shorting functionality can be achieved by running the USC traces 931 parallel to the LCB 910 over the release coat 925, shown in FIG. 56. In the preferred embodiment, a set of tabs, indicated at 935, is added to the silver nano shorting trace 931 which serve to directly contact the associated LCB trace 910 on the non-common side of the circuit with the LCB 910. Thus, if the EST 900 has not been scratched, the parallel USC traces 931 will short to their associated LCB 910 traces. However, when the scratch off coating is removed, the USC traces 931 will be open leaving only the LCB 910 traces that have not been cut by the IR laser to complete the circuit.

To eliminate the need for a scratch detection layer and associated insulators, this embodiment the set of shorting traces 932 of the silver nano ink 930 can be used to form an Activation Key and scratch detector sensor. The Activation Key 932 traces are preferably arranged such that it is highly unlikely that a player could scratch the Activation Key 932 traces without also destroying the USC traces 931.

In this embodiment, a common circuit feed (i.e., +V or Ground) is provided on one edge of the EST 900 at 933 and routed behind the other traces to provide a common bus bar 934. The bus bar 934 is then extended to the other edge of the EST 900 to provide a ticket inserted signal. This bus bar implementation also has the advantage that the ticket 900 must be completely inserted into the GD2 device before the device will actuate.

Finally, to reduce the size of the Activation Key/Scratch-off area 620, a $2^0$ bit trace 935 is routed without an associated USC 931 trace. Generally, this should not pose a security compromise to conductivity pick out where two prize levels (i.e., even and odd) are allocated for the lowest two and highest two prize tiers. In this case, no win lose information can be gained by monitoring the continuity on the uncut $2^0$ bit 935.

As with the first embodiment, a print station 855 can be used to print a nonconductive Upper Blocking Black (UBB), providing opacity, over the Activation Key 620 and Prize Box 618 areas. However, the UBB used in this embodiment differs from the UBB in the previous embodiment in that it preferably is an electrical insulator with a sheet resistivity greater than ten million ohms per square, >10 M$\Omega$/□. FIG. 52 then illustrates that at a print station 860 a SOC can be applied to the EST 900 and at a set of print stations indicated at 865 process colors can be printed on the EST 900 in the manner of the first embodiment.

FIG. 52 also illustrates at a station 870 a perforator, die cutter, in line folder and sheeter that can be used among other functions to remove the gutter portions 900 of the ESTs 900. Otherwise, a rewind mechanism indicated at 875 can then be used to rewind the web 803 for further packaging operations.

It should be understood that the game devices and game cards or lottery tickets have been described in terms of the preferred embodiments. For example, the ESTs described above represent lottery tickets or game cards having a relatively high level of security and that can be manufactured using generally the same printing techniques that are used to print large volumes of instant lottery tickets. The structure of and manufacturing methods used for the game cards can vary based on a number of criteria including: the level of security desired; the method of game play; cost of manufacture; and the characteristics and interfaces of the game devices. For example, there are situations where it would not be necessary or desirable to print the prize amount on the tickets as described above. Similarly, a reduced level of desired security might result in the reduction or elimination of the shorting circuits or one or more of the security layers as described. As another example, IR lasers are described as being used to make the cuts in the LCBs but other methods can be used such as mechanical means for making physical cuts or even printing the LCBs or equivalent circuits with gaps or specially configured printed circuits to program game play. Alternatively, a resist type ink can be prayed selectively on the web in order to prevent the printing of the LCB in a continues form. Also, the preferred method of manufacturing is described as using a flexographic apparatus with an ink jet imager for variable data. However, other intaglio methods can be used and even other methods of printing such as lithography or even a digitally controlled xerographic process can be used, especially where only a limited number of tickets are desired or if the games are particularly simple. As an additional example, scratch off coatings might not be required where, for instance, merely inserting a card into a game device would initiate game play on the device.

We claim:

1. A game card for use with a game having a plurality of possible outcomes comprising:
    a substrate;
    at least one first electrically conductive element on said substrate wherein said element is configured such that the electrical signature of said first element represents a predetermined one of the potential game outcomes;
    wherein the first electrically conductive element is discontinuous and defined with at least one gap, which is free of the material of the first electrically conductive element, the at least one gap altering the electrical signature of said first element to represent a predetermined one of the potential game outcomes; and
    at least one second electrically conductive element that is player removable and effectively alters the electrical signature of the first electrically conductive element by shorting the first electrically conductive element until the second electrically conductive element is removed.

2. The card of claim 1 wherein said predetermined outcome is a prize amount.

3. The card of claim 1 wherein said conductive elements include a printed conductive ink.

4. The card of claim 1 wherein said card includes a barcode having data that represents said predetermined outcome.

5. The card of claim 1 wherein said card includes an additional conductive element identifying the game.

6. The card of claim 1 wherein at least a portion of said conductive elements is composed of a silver nano ink.

7. The card of claim 1 additionally including said predetermined game outcome in a printed human readable indicia covered by a scratch off coating.

8. The card of claim 3 wherein the second conductive element effectively shorts said at least one gap.

9. The card of claim 8 additionally including a scratch off coating over said player removable second conductive element.

10. A set of game cards for a lottery type game comprising:
    a substrate;
    a plurality of first electrically conductive elements printed on said substrate of each of the cards wherein said first electrically conductive elements on each of the cards are configured such that the electrical signatures of said elements represents a predetermined one of a set of potential game outcomes wherein the first electrically conductive elements are discontinuous and defined with at least one gap, which is free of the material of the first electrically conductive elements, the at least one gap altering the electrical signature of said first electrically conductive elements to represent a predetermined one of the set of potential game outcomes wherein different ones of the cards will have different ones of said game outcomes; and
    at least one second electrically conductive element that is player removable and effectively alters said signatures of said first electrically conductive elements by shorting the at least one gap defined within the first electrically conductive elements, until the at least one second electrically conductive element is removed.

11. The cards of claim 10 wherein said circuit elements are printed in conductive ink.

12. The cards of claim 10 additionally including a barcode on each of the cards containing information functionally related to said predetermined game outcome for that card.

13. The cards of claim 10 wherein the second electrically conductive element is covered by a scratch off coating that effectively stigmatizes the card when the scratch off coating is removed by a player.

14. A method of making set of game cards for a lottery type game comprising the steps of:
    printing in conductive ink on a substrate of each of the cards a plurality of first electrically conductive elements;
    modifying selected ones of a plurality of first electrically conductive elements printed on said substrate of each of the cards by defining at least one gap, which is free of the material of the first electrically conductive elements, in the first electrically conductive elements so that they are discontinuous, such that said first electrically conductive elements on each of the cards are configured so that the electrical signatures of said first electrically conductive elements on each of the cards is altered by the at least one gap to represent a predetermined one of a set of potential game outcomes; and
    printing at least one second electrically conductive element that is player removable and effectively alters said signatures of said first electrically conductive elements by shorting the first electrically conductive elements until the at least one second electrically conductive element is removed.

15. The method of claim 14 wherein said modifying step includes altering the resistance of selected ones of said first electrically conductive elements.

16. The method of claim 14 wherein said step of creating said at least one gap includes cutting said at least one gap with a laser.

17. The method of claim 14 including applying the second electrically conductive element to at least a portion of said first electrically conductive elements in order to disguise at least a portion of said alterations.

* * * * *